(12) United States Patent
    Kwon et al.

(10) Patent No.: US 11,398,544 B2
(45) Date of Patent: Jul. 26, 2022

(54) LIGHT DETECTOR, LIGHT DETECTION SYSTEM, LIDAR DEVICE, AND VEHICLE

(71) Applicant: KABUSHIKI KAISHA TOSHIBA, Minato-ku (JP)

(72) Inventors: Honam Kwon, Kawasaki (JP); Ikuo Fujiwara, Yokohama (JP); Keita Sasaki, Yokohama (JP); Kazuhiro Suzuki, Meguro (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 216 days.

(21) Appl. No.: 16/815,987

(22) Filed: Mar. 11, 2020

(65) Prior Publication Data

US 2021/0082986 A1    Mar. 18, 2021

(30) Foreign Application Priority Data

Sep. 18, 2019   (JP) .............................. JP2019-168949

(51) Int. Cl.
   | | |
   |---|---|
   | *H01L 49/02* | (2006.01) |
   | *G01S 17/931* | (2020.01) |
   | *H01L 27/146* | (2006.01) |
   | *H01L 31/02* | (2006.01) |
   | *H01L 31/107* | (2006.01) |

(52) U.S. Cl.
   CPC ............ *H01L 28/20* (2013.01); *G01S 17/931* (2020.01); *H01L 27/14636* (2013.01); *H01L 27/14643* (2013.01); *H01L 31/02027* (2013.01); *H01L 31/107* (2013.01)

(58) Field of Classification Search
   CPC ... H01L 31/107; H01L 27/144; H01L 27/146; H01L 27/14643; H01L 28/20; H01L 28/24; H01C 13/02; H01C 7/06
   See application file for complete search history.

(56) References Cited

U.S. PATENT DOCUMENTS

| | | |
|---|---|---|
| 6,211,769 B1 | 4/2001 | Baldwin et al. |
| 6,759,729 B1 | 7/2004 | Racanelli et al. |
| 9,768,093 B1* | 9/2017 | Lim ..................... H01L 23/522 |
| 10,078,143 B2 | 9/2018 | Sandvik et al. |
| 2002/0089407 A1 | 7/2002 | Bloch |
| 2005/0212071 A1 | 9/2005 | Yue et al. |
| 2006/0097338 A1 | 5/2006 | Park |
| 2006/0163666 A1* | 7/2006 | Shin ................... H01L 27/0629 257/379 |
| 2009/0256223 A1 | 10/2009 | Yamamura et al. |

(Continued)

FOREIGN PATENT DOCUMENTS

| | | |
|---|---|---|
| JP | 2007-080905 A | 3/2007 |
| JP | 2007-531281 A | 11/2007 |

(Continued)

*Primary Examiner* — Alia Sabur
(74) *Attorney, Agent, or Firm* — Oblon, McClelland, Maier & Neustadt, L.L.P.

(57) ABSTRACT

According to one embodiment, a light detector includes an element and a quenching resistance. The element includes a photodiode. The quenching resistance is electrically connected to the element. The quenching resistance includes a semiconductor member and a plurality of first metal members. The plurality of first metal members is electrically connected to the semiconductor member and separated from each other.

20 Claims, 20 Drawing Sheets

(56) References Cited

U.S. PATENT DOCUMENTS

| | | |
|---|---|---|
| 2010/0155867 A1 | 6/2010 | Arai |
| 2014/0011081 A1 | 4/2014 | Yamamoto et al. |
| 2014/0231951 A1* | 8/2014 | Yoon .................. H01L 31/1804 |
| | | 257/461 |
| 2017/0192112 A1 | 7/2017 | Sandvik et al. |
| 2018/0120441 A1* | 5/2018 | Elooz ...................... G01S 7/497 |
| 2018/0284285 A1* | 10/2018 | Curatu .................. G01S 7/4816 |
| 2020/0025934 A1 | 1/2020 | Kwon et al. |
| 2021/0063545 A1 | 3/2021 | Kwon et al. |

FOREIGN PATENT DOCUMENTS

| | | |
|---|---|---|
| JP | 5536853 B2 | 7/2014 |
| JP | 5616552 B2 | 10/2014 |
| JP | 5984617 B2 | 9/2016 |
| JP | 2020-013950 A | 1/2020 |
| JP | 2021-34698 A | 3/2021 |
| KR | 10-2009-0129123 | 12/2009 |

* cited by examiner

LIGHT DETECTOR, LIGHT DETECTION SYSTEM, LIDAR DEVICE, AND VEHICLE

CROSS-REFERENCE TO RELATED APPLICATIONS

This application is based upon and claims the benefit of priority from Japanese Patent Application No. 2019-168949, filed on Sep. 18, 2019; the entire contents of which are incorporated herein by reference.

FIELD

Embodiments described herein relate generally to a light detector, a light detection system, a lidar device, and a vehicle.

BACKGROUND

There is a light detector including a quenching resistance. It is desirable to reduce the temperature dependence of the electrical resistance of the quenching resistance.

DETAILED DESCRIPTION

Figure 1:
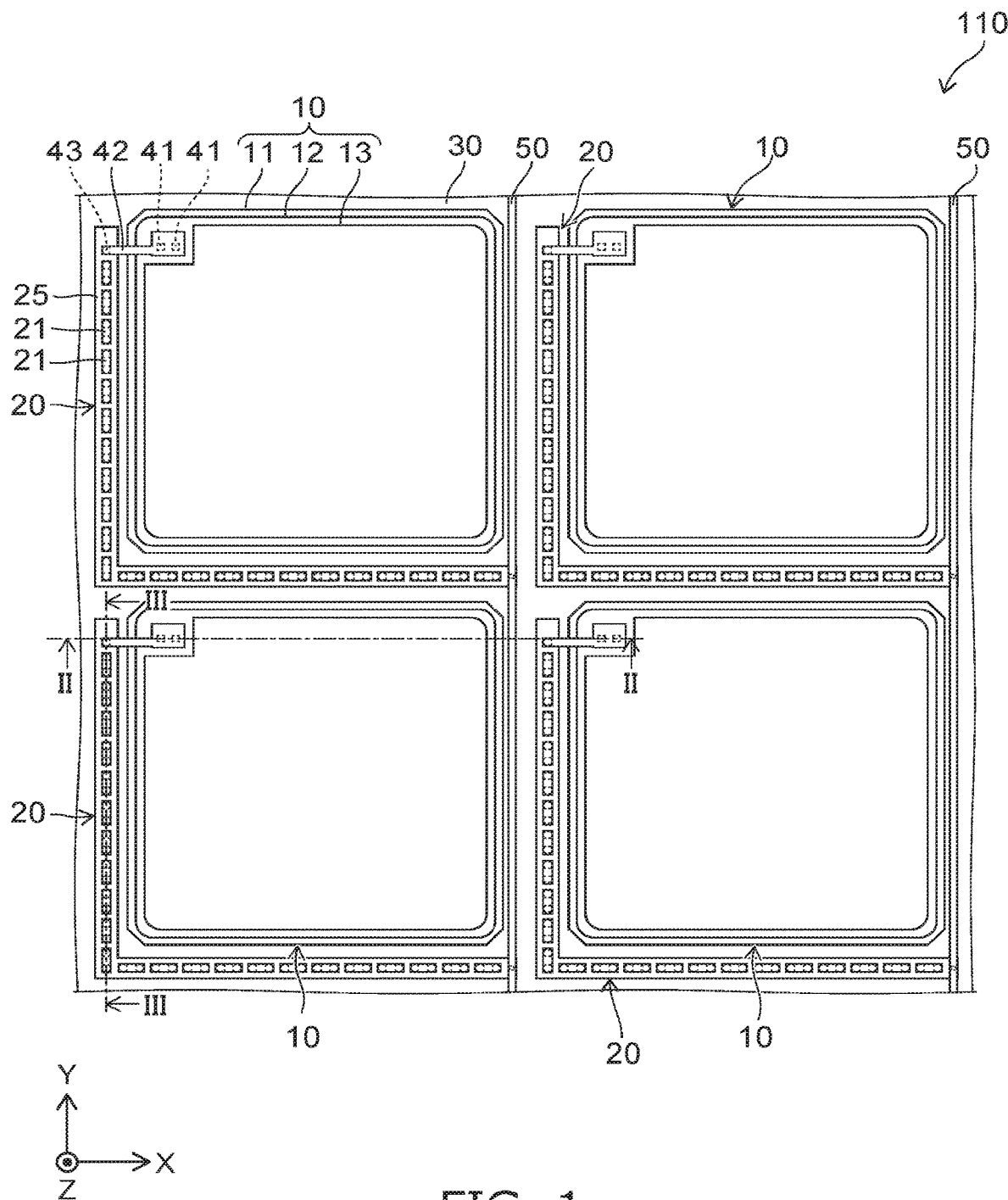
FIG. 1 is a schematic plan view illustrating a light detector according to a first embodiment.

According to one embodiment, a light detector includes an element and a quenching resistance. The element includes a photodiode. The quenching resistance is electrically connected to the element. The quenching resistance includes a semiconductor member and a plurality of first metal members. The plurality of first metal members is electrically connected to the semiconductor member and separated from each other.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic plan view illustrating a light detector according to a first embodiment.

Figure 2:
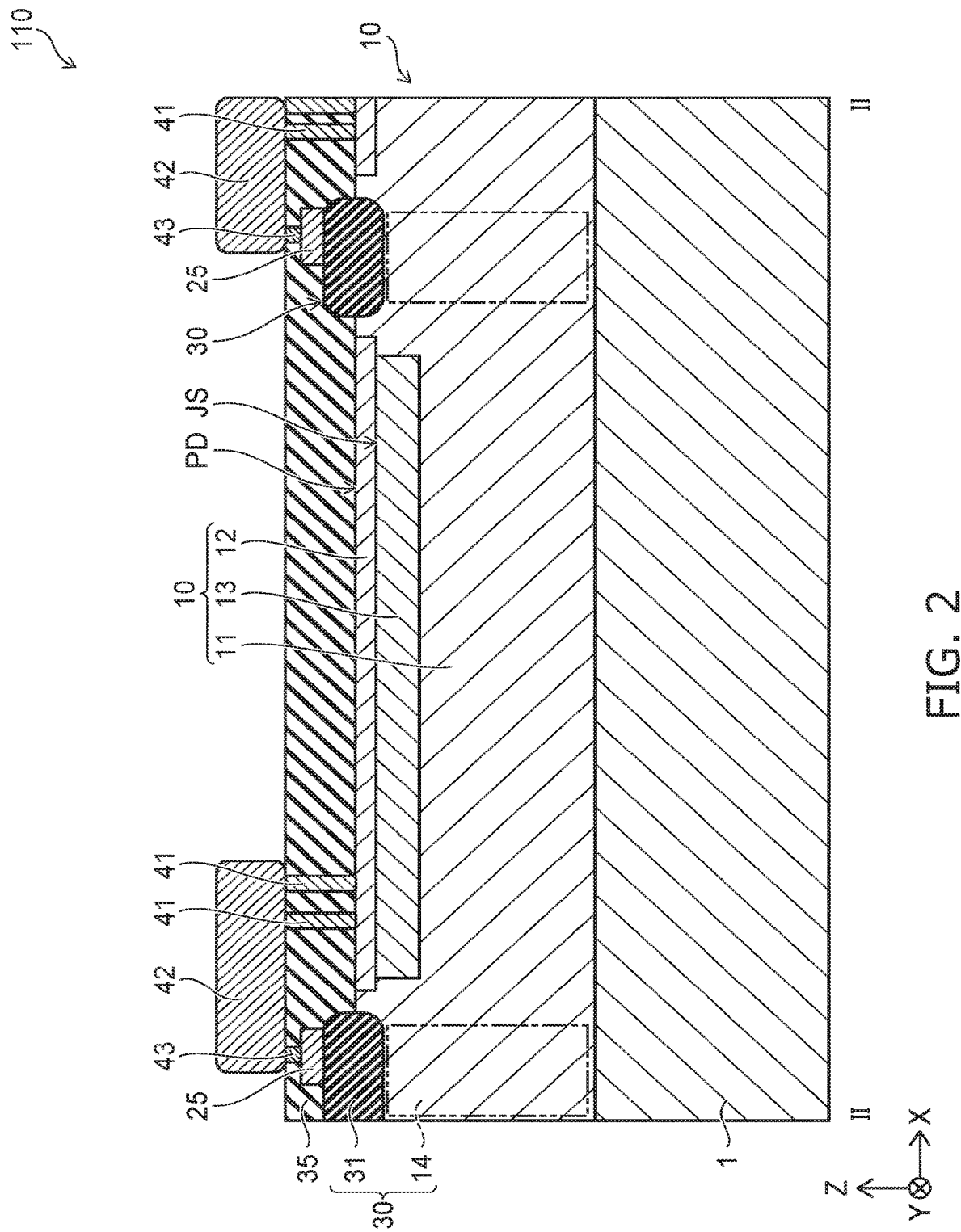
FIG. 2 is a II-II cross-sectional view of FIG. 1.

FIG. 2 is a II-II cross-sectional view of FIG. 1.

Figure 3:
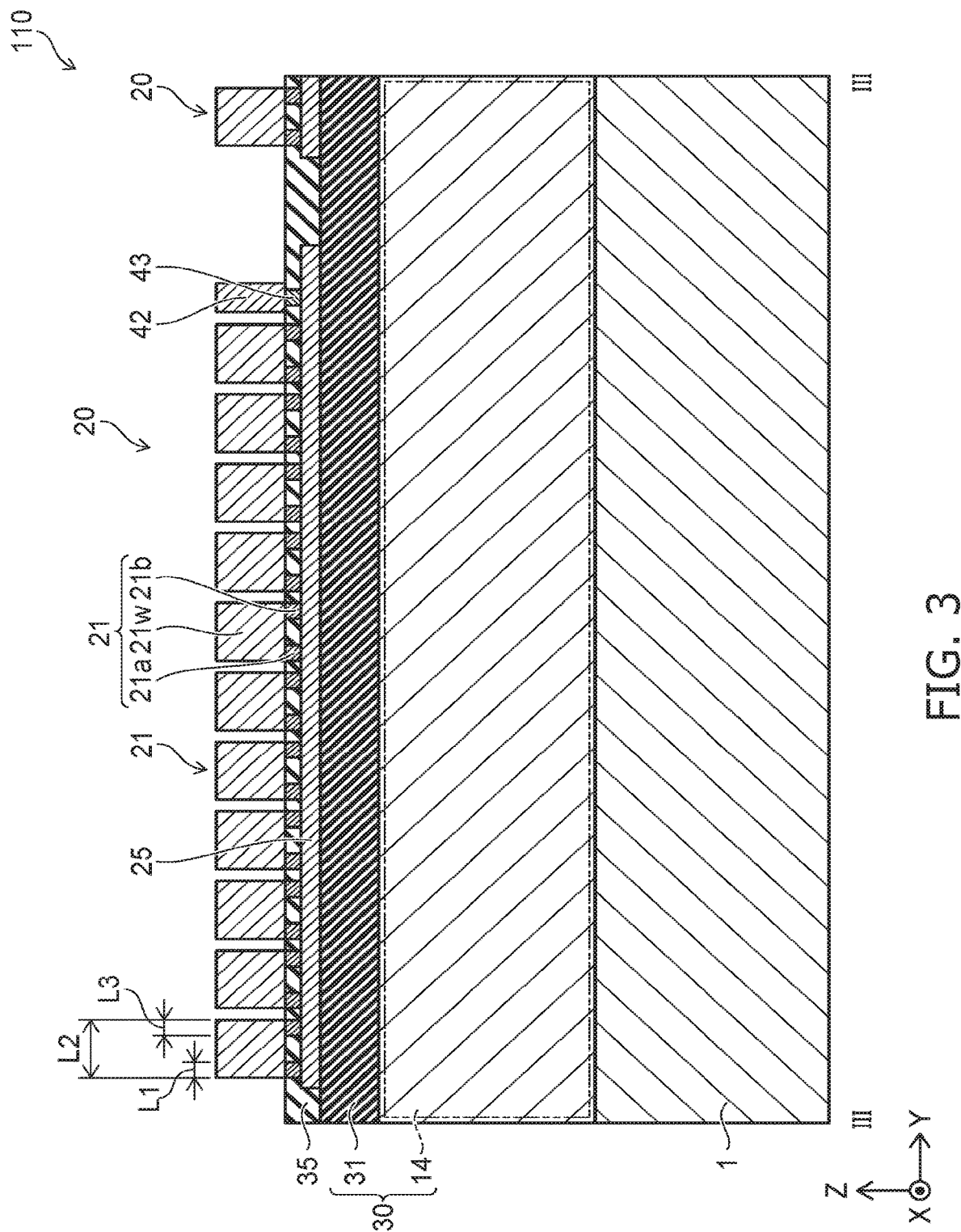
FIG. 3 is a III-III cross-sectional view of FIG. 1.

FIG. 3 is a III-III cross-sectional view of FIG. 1.

As shown in FIG. 1 to FIG. 3, the light detector 110 according to the first embodiment includes a conductive layer 1, an element 10, a quenching resistance 20, a perimeter region 30, an insulating layer 35, a connection part 41, a wiring layer 42, a connection part 43, and a common line 50.

The element 10 includes a photodiode and is surrounded with the perimeter region 30 in a first direction. The element 10 and the perimeter region 30 are provided between the conductive layer 1 and the quenching resistance 20, the insulating layer 35, the connection part 41, the wiring layer 42, the connection part 43, and the common line 50 in a second direction crossing the first direction.

One direction that crosses a plane including the first direction and the second direction is taken as a third direction. For example, the first direction is along an X-direction shown in FIG. 1 to FIG. 3. The second direction is along a Z-direction perpendicular to the X-direction. The third direction is along a Y-direction perpendicular to the X-direction and the Z-direction. Hereinbelow, the case is described where the first direction, the second direction, and the third direction are respectively along the X-direction, the Z-direction, and the Y-direction.

As shown in FIG. 2, the element 10 includes a photodiode PD. Specifically, the element 10 includes a first semiconductor region 11 of a first conductivity type, a second semiconductor region 12 of a second conductivity type, and a third semiconductor region 13 of the first conductivity type. The third semiconductor region 13 is provided between the first semiconductor region 11 and the second semiconductor region 12 in the Z-direction. The photodiode PD includes the second semiconductor region 12 and the third semiconductor region 13. The photodiode PD includes a p-n junction JS. The p-n junction JS is formed by the second semiconductor region 12 and the third semiconductor region 13. The p-n junction spreads along the X-Y plane.

The first conductivity type is one of a p-type or an n-type. The second conductivity type is the other of the p-type or the n-type. Hereinbelow, the case will be described where the first conductivity type is the p-type, and the second conductivity type is the n-type.

The p-type impurity concentration in the third semiconductor region 13 is higher than the p-type impurity concentration in the first semiconductor region 11. For example, the n-type impurity concentration in the second semiconductor region 12 is higher than the p-type impurity concentration in the third semiconductor region 13.

As shown in FIG. 1, multiple elements 10 are provided in the X-direction and the Y-direction. Carriers are generated when light is incident on each element 10. The light detector 110 detects the light incident on the elements 10 as electrical signals.

As shown in FIG. 2, the conductive layer 1 spreads along the X-direction and the Y-direction and is arranged in the Z-direction with the multiple elements 10. The elements 10 are electrically connected to the conductive layer 1. A voltage is applied between the second semiconductor region 12 and the third semiconductor region 13 by controlling the potential of the conductive layer 1. For example, the elements 10 function as avalanche photodiodes.

For example, a reverse voltage that exceeds the breakdown voltage is applied to the photodiode PD. Thereby, the photodiode PD operates in a Geiger mode. By operating in the Geiger mode, the light detection efficiency can be increased; and micro photons can be detected.

The elements 10 are surrounded with the perimeter region 30 in the X-direction and the Y-direction. In the example of FIG. 1 to FIG. 3, the perimeter region 30 includes an insulating part 31, and a fourth semiconductor region 14 which is of the first conductivity type. The insulating part 31 is arranged with the fourth semiconductor region 14 in the Z-direction. The insulating part 31 surrounds the second semiconductor region 12 in the X-direction and the Y-direction. The insulating part 31 also may surround the third semiconductor region 13. The fourth semiconductor region 14 surrounds the first semiconductor region 11 in the X-direction and the Y-direction. The fourth semiconductor region 14 also may surround the third semiconductor region 13. For example, the fourth semiconductor region 14 is provided as a continuous body with the first semiconductor region 11.

Herein, "surround" includes not only the case where an unbroken component continuously surrounds another component, but also includes the case where multiple components are separated from each other and arranged around the other component. For example, the other component can be considered to be surrounded with the multiple components when the other component is positioned inside a path obtained by tracing along the multiple components.

For example, in the X-direction and the Y-direction, a portion of the first semiconductor region 11 is provided between the second semiconductor region 12 and the insulating part 31 and between the third semiconductor region 13 and the insulating part 31. Or, the second semiconductor region 12 and the third semiconductor region 13 may contact the insulating part 31.

One end of the quenching resistance 20 is electrically connected to the second semiconductor region 12 via the connection part 41, the wiring layer 42, and the connection part 43. The other end of the quenching resistance 20 is electrically connected to the common line 50.

The electrical resistance of the quenching resistance 20 is greater than the electrical resistances of the connection part 41, the wiring layer 42, the connection part 43, and the common line 50. It is favorable for the electrical resistance of the quenching resistance 20 to be not less than 50 kΩ and not more than 2 MΩ.

The quenching resistance 20 is provided to suppress the continuation of avalanche breakdown when light is incident on the element 10 and avalanche breakdown occurs. In other words, when avalanche breakdown occurs and a current flows in the quenching resistance 20, a voltage drop that corresponds to the electrical resistance of the quenching resistance 20 occurs. Due to the voltage drop, the potential difference between the second semiconductor region 12 and the third semiconductor region 13 is reduced; and the avalanche breakdown stops. The next light that is incident on the element 10 can be detected thereby.

As shown in FIG. 1 to FIG. 3, the quenching resistance includes multiple first metal members 21 and a semiconductor member 25. The multiple first metal members 21 are separated from each other. The first metal members 21 are electrically connected to the semiconductor member 25.

The first metal members 21 are arranged with the semiconductor member 25 in the Z-direction. The semiconductor member 25 is provided between the perimeter region 30 and the multiple first metal members 21 in the Z-direction. Or, the multiple first metal members 21 may be provided between the perimeter region 30 and the semiconductor member 25 in the Z-direction.

The first metal member 21 includes a first wiring part 21$w$, a first connection part 21$a$, and a second connection part 21$b$. The first wiring part 21$w$ is separated from the semiconductor member 25 in the Z-direction. The insulating layer 35 is provided between the semiconductor member 25 and the first wiring part 21$w$. The first connection part 21$a$ and the second connection part 21$b$ are provided between the semiconductor member 25 and the first wiring part 21$w$ in the Z-direction and are surrounded with the insulating layer 35 in the X-direction and the Y-direction. The first connection part 21$a$ electrically connects the semiconductor member 25 and one end of the first wiring part 21$w$. The second connection part 21$b$ electrically connects the semiconductor member 25 and the other end of the first wiring part 21$w$.

For example, the direction in which the multiple first metal members 21 are arranged and the direction in which the first wiring part 21$w$ extends are along the direction in which the semiconductor member 25 extends. Herein, "extend" means that the length in some one direction is greater than the length in a direction perpendicular to the one direction. For example, as shown in FIG. 1, a portion of the semiconductor member 25 extends along the Y-direction. The multiple first metal members 21 that are arranged in the Y-direction are electrically connected to the portion of the semiconductor member 25. The first wiring parts 21$w$ extend along the Y-direction in these first metal members 21. Another portion of the semiconductor member 25 extends along the X-direction. The multiple first metal members 21 that are arranged in the X-direction are electrically connected to the other portion of the semiconductor member 25. The first wiring parts 21$w$ extend along the X-direction in these first metal members 21.

As shown in FIG. 2 and FIG. 3, at least a portion of the quenching resistance 20 is arranged with the perimeter region in the Z-direction. The insulating part 31 is provided between the fourth semiconductor region 14 and the quenching resistance 20 in the Z-direction.

For example, multiple common lines 50 are provided in the X-direction; and the common lines 50 each extend in the Y-direction. One common line 50 that extends in the Y-direction is electrically connected to multiple quenching resistances 20 arranged in the Y-direction. The common lines 50 are arranged with portions of the perimeter region 30 in the Z-direction.

The first semiconductor region 11, the second semiconductor region 12, the third semiconductor region 13, and the fourth semiconductor region 14 include at least one semiconductor material selected from the group consisting of silicon, silicon carbide, gallium arsenide, and gallium nitride. Phosphorus, arsenic, or antimony may be used as the n-type impurity when these semiconductor regions include silicon. Boron may be used as the p-type impurity.

The p-type impurity concentration in the first semiconductor region 11 is, for example, not less than $1.0 \times 10^{13}$ atoms/cm$^3$ and not more than $1.0 \times 10^{16}$ atoms/cm$^3$. By setting this concentration range, a depletion layer spreads sufficiently in the first semiconductor region 11; and the light detection efficiency or the light-receiving sensitivity can be increased.

The n-type impurity concentration in the second semiconductor region 12 is, for example, not less than $1.0 \times 10^{18}$ atoms/cm$^3$ and not more than $1.0 \times 10^{21}$ atoms/cm$^3$. By setting this concentration range, the electrical resistance of the second semiconductor region 12 can be reduced; and the carrier loss in the second semiconductor region 12 can be reduced.

The p-type impurity concentration in the third semiconductor region 13 is, for example, not less than $1.0 \times 10^{16}$ atoms/cm$^3$ and not more than $1.0 \times 10^{18}$ atoms/cm$^3$. By setting this concentration range, the third semiconductor region 13 can have a p-n junction with the second semiconductor region 12; and a depletion layer can spread easily in the third semiconductor region 13.

The conductive layer 1 is, for example, a p-type semiconductor layer. The conductive layer 1 includes the semiconductor materials described above. The p-type impurity concentration in the conductive layer 1 is not less than $1.0 \times 10^{17}$ atoms/cm$^3$ and not more than $1.0 \times 10^{21}$ atoms/cm$^3$. The conductive layer 1 may include a metal. For example, the conductive layer 1 includes at least one selected from the group consisting of aluminum, copper, titanium, gold, and nickel.

The semiconductor member 25 includes at least one semiconductor material selected from the group consisting of polysilicon, silicon carbide, gallium arsenide, and gallium nitride. An n-type impurity or a p-type impurity may be added to the semiconductor member 25. The first metal member 21 includes at least one selected from the group consisting of aluminum, copper, and tungsten. For example, the first wiring part 21w includes aluminum or copper. The first wiring part 21w may include a compound of aluminum. The first connection part 21a and the second connection part 21b include tungsten. By using the tungsten, the length in the X-direction or the Y-direction can be reduced for the first connection part 21a and the second connection part 21b. The electrical resistance between the first connection part 21a and the semiconductor member 25 and the electrical resistance between the second connection part 21b and the semiconductor member 25 can be increased thereby.

The insulating part 31 and the insulating layer 35 include at least one selected from the group consisting of silicon, oxygen, and nitrogen. For example, the insulating part 31 and the insulating layer 35 include silicon oxide. The connection part 41 and the connection part 43 include tungsten. The wiring layer 42 and the common line 50 include at least one selected from the group consisting of aluminum and copper. The wiring layer 42 and the common line 50 may include a compound of aluminum.

Effects of the first embodiment will now be described.

The electrical resistance of the quenching resistance 20 is higher than the electrical resistance of a member such as the common line 50 or the like which includes a metal. To increase the electrical resistance, a semiconductor such as polysilicon or the like is included favorably in the quenching resistance 20. On the other hand, heat is generated when a current flows through the quenching resistance 20. The electrical resistance of the semiconductor decreases as the temperature increases. In the case where the quenching resistance 20 includes a semiconductor, the electrical resistance of the quenching resistance 20 decreases when the temperature of the quenching resistance 20 increases. As a result, the voltage drop when the current flows through the quenching resistance 20 decreases; and the time until the avalanche breakdown stops lengthens. The dead time from when the light is detected by the element 10 until the state in which the next light can be detected lengthens. Accordingly, it is desirable for the temperature dependence of the electrical resistance of the quenching resistance 20 to be small.

A metal and a semiconductor have different temperature characteristics. Namely, the electrical resistance of a metal increases as the temperature increases. There is also a method of using both a semiconductor and a metal in the quenching resistance to relax the temperature dependence of the semiconductor. However, the electrical resistance of the metal is extremely small compared to the electrical resistance of the semiconductor. Accordingly, when some prescribed temperature change occurs, the change of the electrical resistance of the metal is much less than the change of the electrical resistance of the semiconductor. For example, even if a semiconductor and a metal are connected in series, the change of the electrical resistance of the metal is too small; therefore, the temperature dependence of the electrical resistance of the quenching resistance 20 cannot be reduced sufficiently.

In the light detector 110 according to the first embodiment, the multiple first metal members 21 are separated from each other; and the first metal members 21 are electrically connected to the semiconductor member 25. The electrical resistance of the first metal member 21 can be increased by separating the first metal members 21 from each other. Accordingly, the change of the electrical resistance of the first metal member 21 with respect to the temperature change can be increased. The decrease of the electrical resistance of the quenching resistance 20 when the temperature of the quenching resistance 20 increases can be suppressed. In other words, according to the first embodiment, the temperature dependence of the electrical resistance of the quenching resistance 20 can be reduced.

It is favorable for at least a portion of the quenching resistance 20 to be arranged with the perimeter region 30 in the Z-direction. It is more favorable for the entire quenching resistance 20 to be arranged with the perimeter region 30 in the Z-direction. In other words, when viewed from the Z-direction, it is favorable for the quenching resistance 20 not to overlap the first semiconductor region 11 or the second semiconductor region 12. The shielding by the quenching resistance 20 of the light traveling toward the element 10 can be suppressed thereby; and the light detection efficiency of the light detector 110 can be increased.

For example, the area of the quenching resistance 20 is defined based on the semiconductor member 25. In the light detector 110, one end of the semiconductor member 25 is electrically connected to the connection part 41; and the other end of the semiconductor member 25 is electrically connected to the common line 50. The quenching resistance 20 corresponds to the intermediate portion from the one end to the other end of the semiconductor member 25, and the multiple first metal members 21 electrically connected to the intermediate portion.

The semiconductor member 25 and the first metal members 21 may be arranged in the X-direction or the Y-direction instead of the Z-direction. However, favorably, the semiconductor member 25 and the first metal members 21 are arranged in the Z-direction.

When the semiconductor member 25 and the first metal members 21 are arranged in the X-direction or the Y-direction, it is necessary to pattern the configurations of the semiconductor member 25 and the first metal members 21 in the X-Y plane to be electrically connected to each other. The processing that is necessary for such patterning is complex compared to the processing when the semiconductor member and the first metal members 21 are arranged in the Z-direction. Also, the X-Y plane surface area of the quenching resistance 20 increases.

By arranging the semiconductor member 25 and the first metal members 21 in the Z-direction, for example, the semiconductor member 25 and the first metal members 21 can be connected more reliably. The fluctuation of the characteristics of the quenching resistance 20 can be reduced thereby; and the yield of the light detector 110 can be increased. Also, the X-Y plane surface area of the quenching resistance 20 can be smaller. The shielding by the quenching resistance 20 of the light traveling toward the element 10 can be suppressed thereby; and the light detection efficiency of the light detector 110 can be increased.

In the light detector 110 as shown in FIG. 1 and FIG. 3, the first metal members 21 are connected in parallel respectively to portions of one semiconductor member 25 between the second semiconductor region 12 and the common line 50. Thereby, for example, the electrical resistance of the semiconductor member 25 can be less than when the multiple semiconductor members 25 are separated from each other. The electrical resistance difference between the semiconductor member 25 and the first metal member 21 decreases as the electrical resistance of the semiconductor member 25 decreases. In other words, the difference between the change of the electrical resistance of the semiconductor member 25 and the change of the electrical resistance of the first metal member 21 can be small when some prescribed temperature change occurs. Accordingly, the temperature dependence of the electrical resistance of the quenching resistance 20 can be reduced further.

In the light detector 110, the first metal member 21 includes the first wiring part 21w, the first connection part 21a, and the second connection part 21b. The first connection part 21a and the second connection part 21b are surrounded with the insulating layer 35 in the X-direction and the Y-direction and are electrically connected to the first wiring part 21w. The electrical resistances of the first connection part 21a and the second connection part 21b are higher than the electrical resistance of the first wiring part 21w. The electrical resistance of the first metal member 21 is increased by electrically connecting the first wiring part 21w to the semiconductor member 25 via the first connection part 21a and the second connection part 21b. In other words, the difference between the change of the electrical resistance of the semiconductor member 25 and the change of the electrical resistance of the first metal member 21 can be small when some prescribed temperature change occurs. Accordingly, the temperature dependence of the electrical resistance of the quenching resistance 20 can be reduced further.

For example, the lengths of the first connection part 21a and the second connection part 21b in one direction perpendicular to the Z-direction are less than the length of the first wiring part 21w in the one direction. In the light detector 110 as shown in FIG. 3, for the first metal members 21 electrically connected to a portion of the semiconductor member 25 extending in the Y-direction, a length L1 of the first connection part 21a in the Y-direction is less than a length L2 of the first wiring part 21w in the Y-direction. A length L3 of the second connection part 21b in the Y-direction is less than the length L2.

It is favorable for the perimeter region 30 to include the insulating part 31. Because the insulating part 31 is included, the flow of the carriers generated in each element 10 toward the adjacent elements 10 can be suppressed. In other words, the crosstalk in the light detector 110 can be reduced.

In the quenching resistance 20, it is favorable for the ratio of the electrical resistance of a portion of the semiconductor member 25 to the electrical resistance of one first metal member 21 connected in parallel to the portion of the semiconductor member 25 to be not less than 0.05 and not more than 2. For example, the ratio can be within this range by employing at least one of the features described above.

Modification

Figure 4:
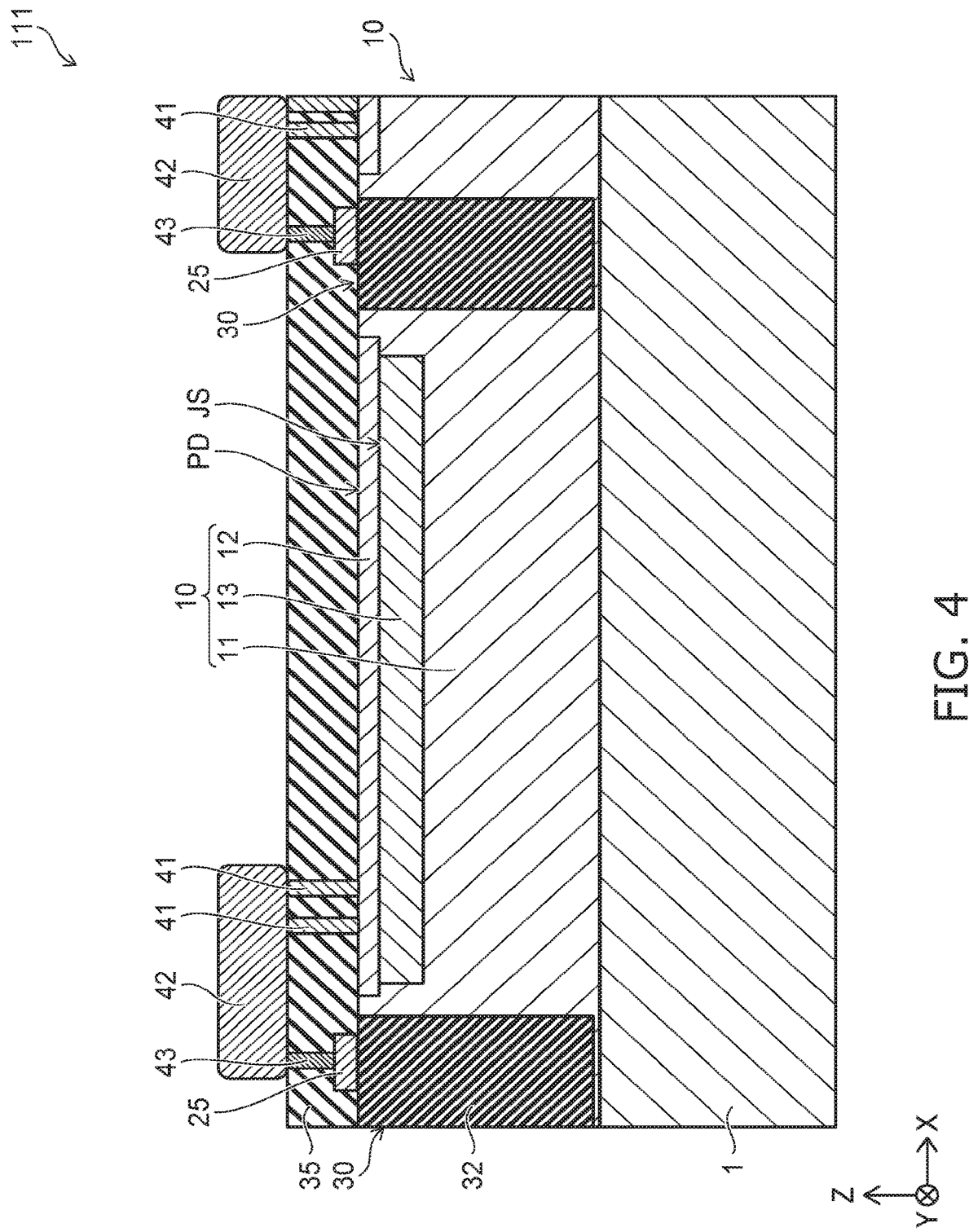
FIG. 4 is a schematic plan view illustrating a light detector according to a modification of the first embodiment.

FIG. 4 is a schematic plan view illustrating a light detector according to a modification of the first embodiment.

In the light detector 111 according to the modification as shown in FIG. 4, the perimeter region 30 includes an insulating part 32. The insulating part 32 surrounds the third semiconductor region 13, the second semiconductor region 12, and at least a portion of the first semiconductor region 11 in the X-direction and the Y-direction.

The insulating part 32 may contact the conductive layer 1. A semiconductor region of the first conductivity type may be provided between the insulating part 32 and the conductive layer 1. For example, in the X-direction and the Y-direction, a portion of the first semiconductor region 11 is provided between the second semiconductor region 12 and the insulating part 32 and between the third semiconductor region 13 and the insulating part 32. Or, the second semiconductor region 12 and the third semiconductor region 13 may contact the insulating part 32.

The insulating part 32 includes at least one selected from the group consisting of silicon, oxygen, and nitrogen. For example, the insulating part 32 includes silicon oxide.

The configuration of the quenching resistance 20 of the light detector 111 is the same as the configuration of the quenching resistance 20 of the light detector 110. Accordingly, according to the modification, the temperature dependence of the electrical resistance of the quenching resistance 20 can be reduced similarly to the first embodiment.

Also, the crosstalk between the elements 10 can be reduced further by providing, instead of the insulating part 31, the insulating part 32 which is longer than the insulating part 31 in the Z-direction.

Second Embodiment

Figure 5:
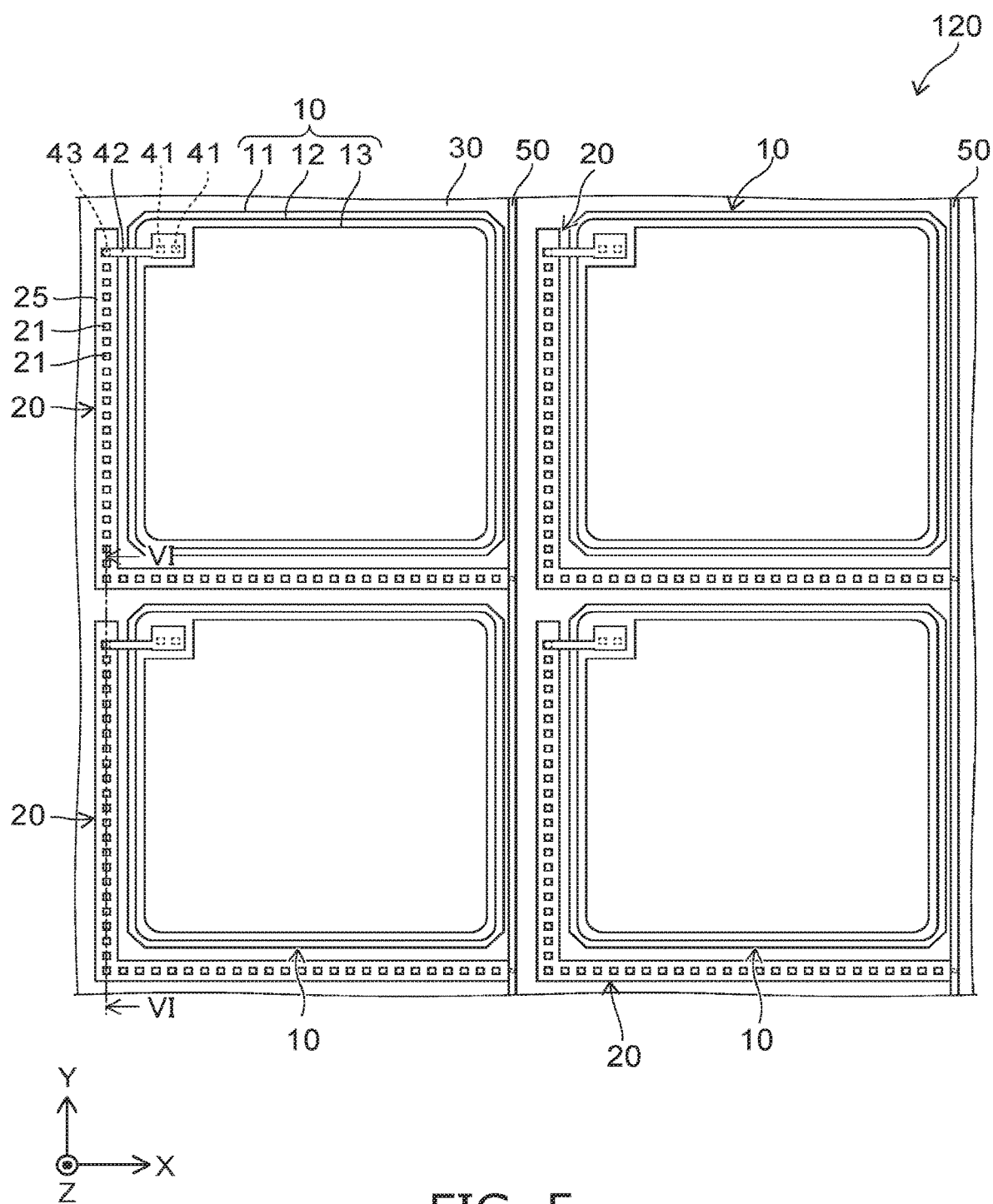
FIG. 5 is a schematic plan view illustrating a light detector according to a second embodiment.

FIG. 5 is a schematic plan view illustrating a light detector according to a second embodiment.

Figure 6:
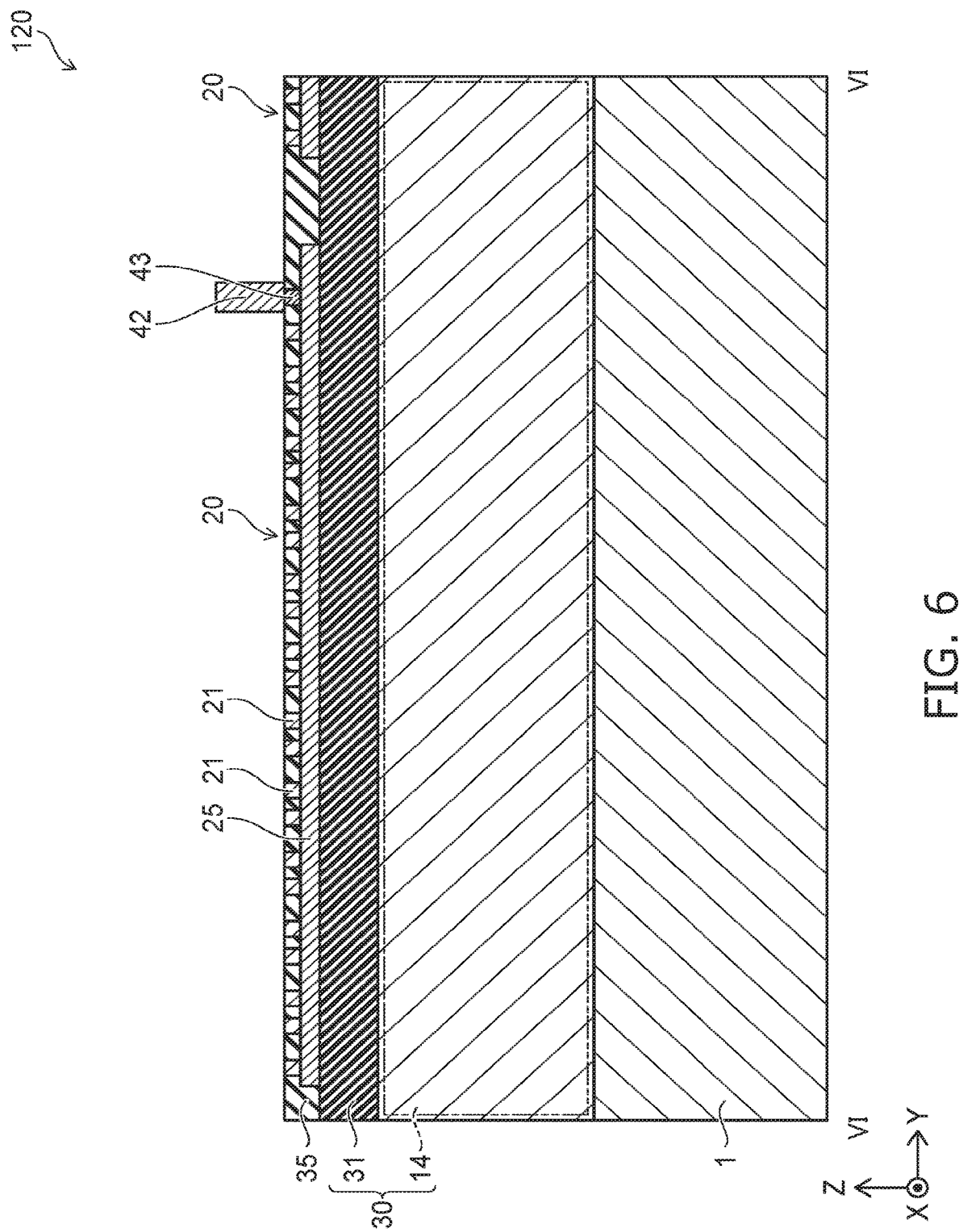
FIG. 6 is a V-V cross-sectional view of FIG. 5.

FIG. 6 is a V-V cross-sectional view of FIG. 5.

The light detector 120 according to the second embodiment differs from the light detector 110 according to the first embodiment in that the first metal member 21 does not include the first wiring part 21w. In other words, in the light detector 120, the first connection part 21a and the second connection part 21b of the light detector 110 correspond respectively to the first metal members 21.

As shown in FIG. 5 and FIG. 6, the first metal members 21 are electrically connected to the semiconductor member 25 and are surrounded with the insulating layer 35 in the X-direction and the Y-direction. A current flows in the first metal members 21 in parallel to portions of the semiconductor member 25.

In the first metal member 21 of the light detector 110, the electrical resistance of the first wiring part 21w is lower than the electrical resistances of the first connection part 21a and the second connection part 21b. The electrical resistance of the first metal member 21 is increased by not providing the first wiring part 21w. According to the second embodiment, compared to the first embodiment, the electrical resistance of the first metal member 21 can be increased.

It is also possible to further increase the resistances of the first metal members 21 by adjusting the contact area between the semiconductor member 25 and the first metal member 21, the number of the first metal members 21, etc. For example, it is favorable for the ratio of the total of the surface area of the contact portion between the semiconductor member 25 and the first metal members 21 to the surface area along the X-Y plane of the semiconductor member 25 to be not less than 0.3 and not more than 0.95. By setting the ratio to be 0.3 or more, the resistance of the first metal members 21 can be increased favorably. However, if the ratio is too large, it is difficult to separate the multiple first metal members 21 from each other; therefore, it is favorable for the ratio to be 0.95 or less.

Third Embodiment

Figure 7:
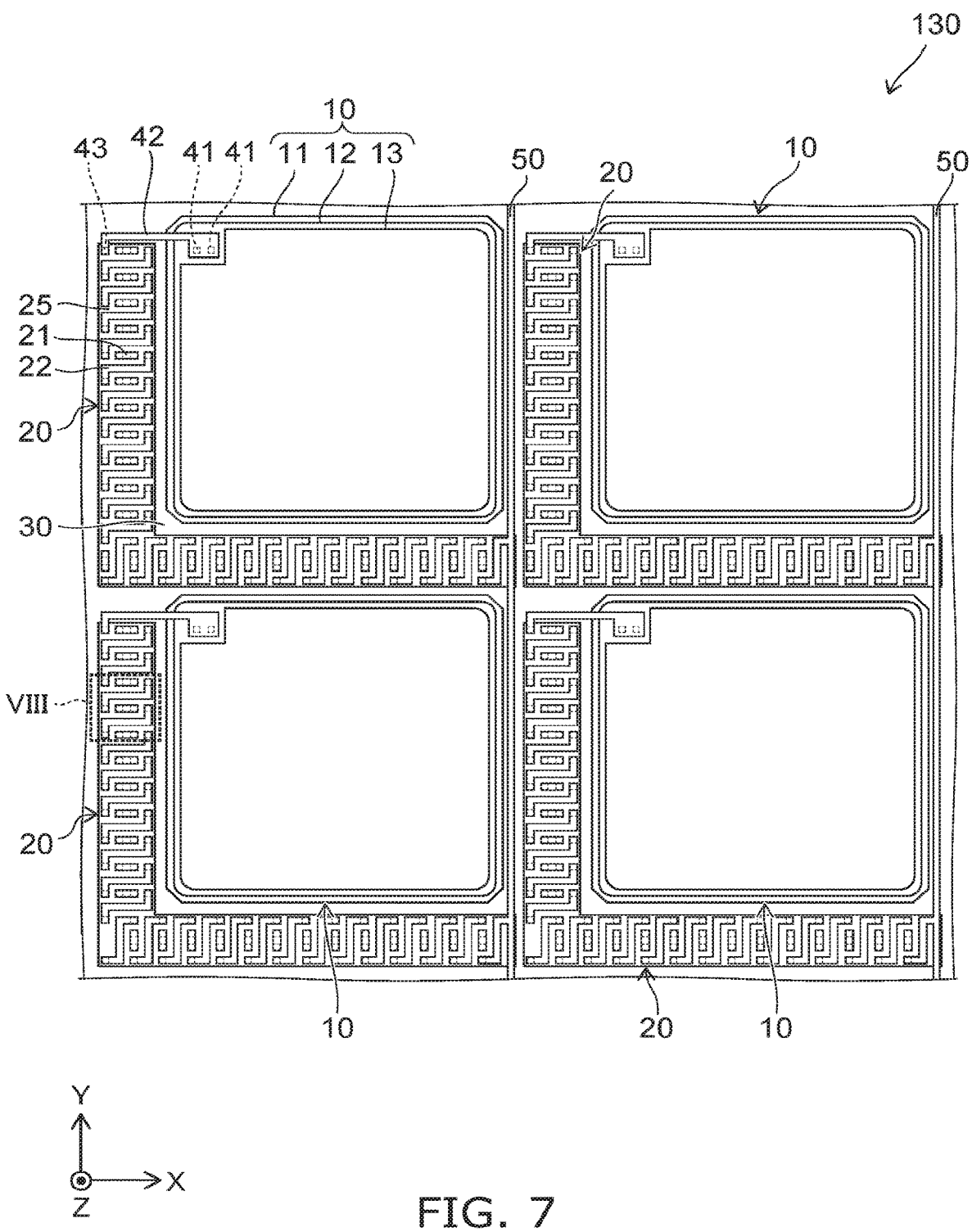
FIG. 7 is a schematic plan view illustrating a light detector according to a third embodiment.

FIG. 7 is a schematic plan view illustrating a light detector according to a third embodiment.

Figure 8:
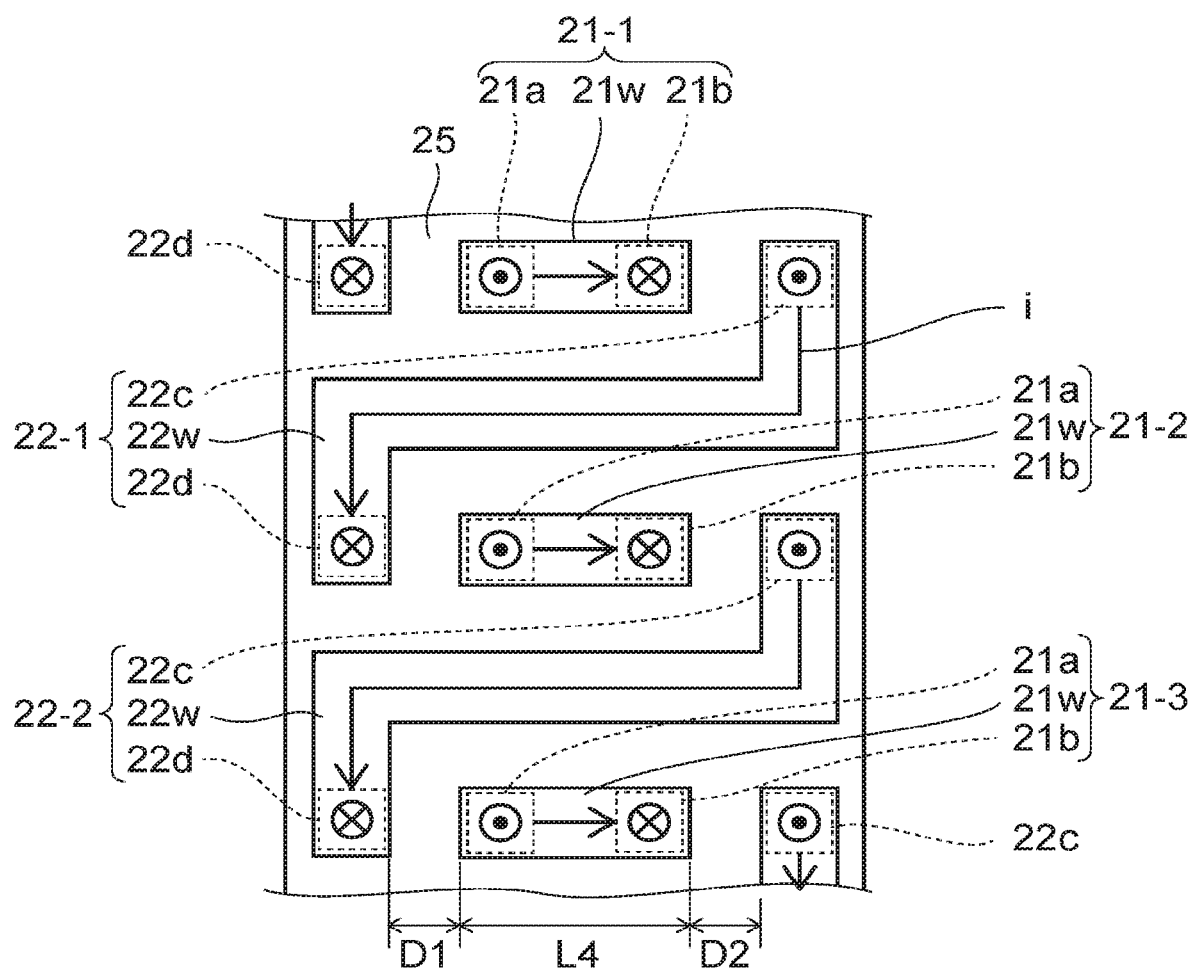
FIG. 8 is a plan view in which portion VIII of FIG. 7 is enlarged.

FIG. 8 is a plan view in which portion VIII of FIG. 7 is enlarged.

As shown in FIG. 7, the light detector 130 according to the third embodiment differs from the light detector 110 in that the quenching resistance 20 further includes multiple second metal members 22.

The multiple first metal members 21 and the multiple second metal members 22 are separated from each other. As shown in FIG. 8, each first metal member 21 includes the first wiring part 21w, the first connection part 21a, and the second connection part 21b. Each second metal member 22 includes a second wiring part 22w, a third connection part 22c, and a fourth connection part 22d.

In the light detector 130, the first wiring part 21w extends in a direction crossing the direction in which the semiconductor member 25 extends. The first connection part 21a and the second connection part 21b are arranged in the cross direction and are electrically connected respectively to the two ends of the first wiring part 21w. In the example shown in FIG. 8, the first metal members 21 are electrically connected to a portion of the semiconductor member 25 extending in the Y-direction. The first wiring part 21w of the first metal member 21 extends in the X-direction. The first connection part 21a and the second connection part 21b are arranged in the X-direction and electrically connected respectively to the two X-direction ends of the first wiring part 21w.

The third connection part 22c of the second metal member 22 is arranged with the first connection part 21a or the second connection part 21b of one first metal member 21 in the cross direction recited above. The fourth connection part 22d is arranged with the first connection part 21a or the second connection part 21b of another one first metal member 21 in the cross direction recited above. At least a portion of the second wiring part 22w of the second metal member 22 is arranged with the first wiring part 21w of the one first metal member 21 and the first wiring part 21w of the other one first metal member 21 in the cross direction recited above.

For example, two second metal members 22-1 and 22-2 are shown in FIG. 8. Three first metal members 21-1 to 21-3 also are shown. The third connection part 22c of the second metal member 22-2 is arranged in the X-direction with the first connection part 21a and the second connection part 21b of the first metal member 21-2. The fourth connection part 22d of the second metal member 22-2 is arranged in the X-direction with the first connection part 21a and the second connection part 21b of the first metal member 21-3. At least a portion of the first wiring part 21w of the first metal member 21-2 is arranged with the second wiring part 22w of the second metal member 22-1 and the second wiring part 22w of the second metal member 22-2 in the X-direction.

A current i shown by arrows and symbols in FIG. 8 flows in the first metal member 21 and the second metal member 22. As shown in FIG. 8, the current i flows along the X-direction through the first wiring part 21w. The current i also flows along the X-direction through a portion of the second wiring part 22w. On the other hand, the current flows along the Y-direction in the semiconductor member 25. Therefore, according to the first metal member 21 and the second metal member 22 of the light detector 130, compared to the first embodiment, the electrical resistance of the metal part of the quenching resistance 20 can be increased further.

It is favorable for a distance D1 between the first connection part 21a and the fourth connection part 22d arranged in the X-direction and a distance D2 between the second connection part 21b and the third connection part 22c arranged in the X-direction to be short. The resistance component of the semiconductor member 25 in the quenching resistance 20 decreases as the distances D1 and D2 decrease. For example, it is favorable for the distances D1 and D2 to be not more than 0.5 times a length L4 of the first wiring part 21w. On the other hand, the degree of difficulty of the formation of the first connection part 21a, the second connection part 21b, the third connection part 22c, and the fourth connection part 22d increases when the distances D1 and D2 are not more than 0.25 times the length L4. Accordingly, to increase the yield of the light detector 130 while reducing the resistance component of the semiconductor member 25, it is favorable for the distance D1 to be not less than 0.25 times and not more than 0.5 times the length L4. Also, it is favorable for the distance D2 to be not less than 0.25 times and not more than 0.5 times the length L4.

Fourth Embodiment

Figure 9:
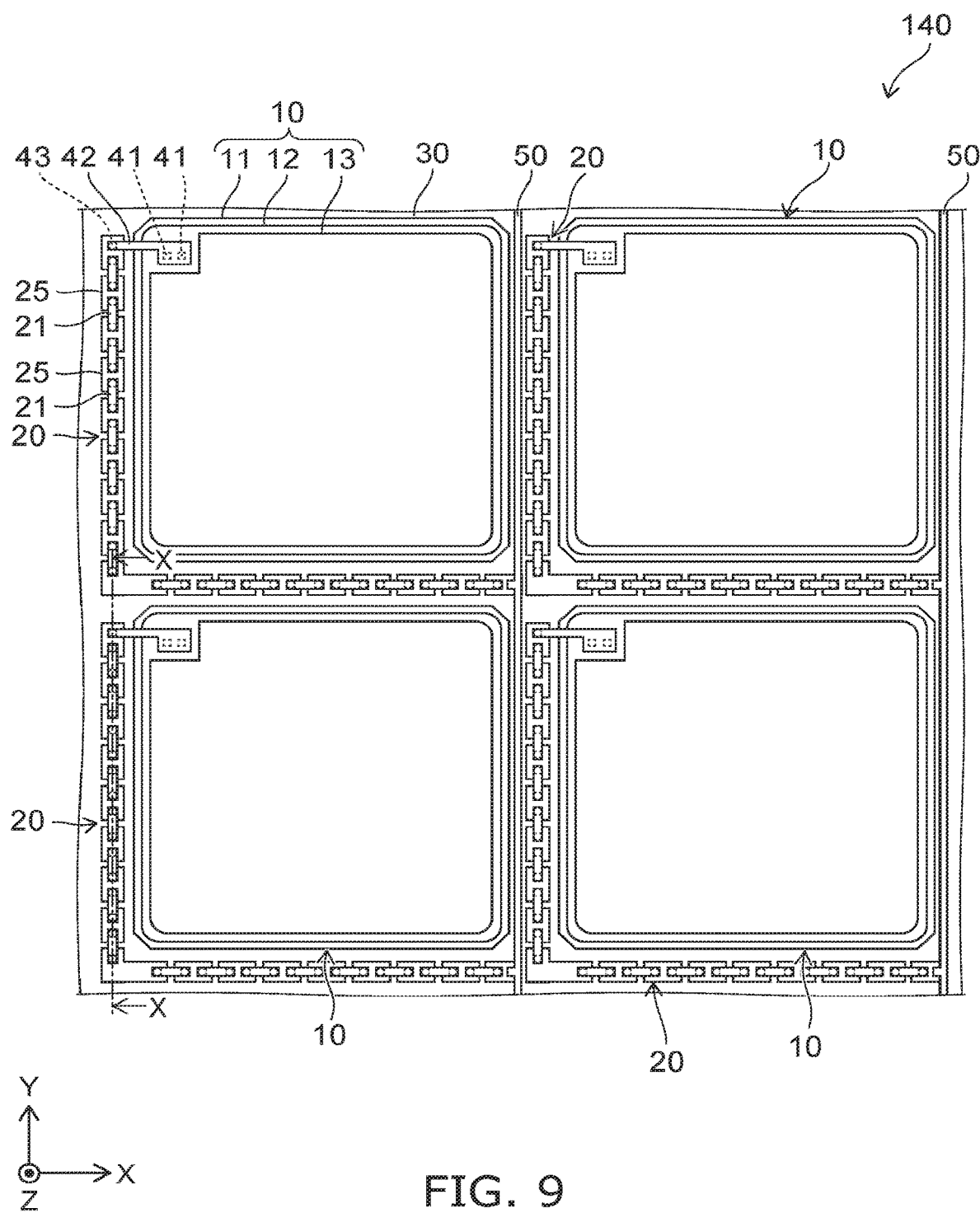
FIG. 9 is a schematic plan view illustrating a light detector according to a fourth embodiment.

FIG. 9 is a schematic plan view illustrating a light detector according to a fourth embodiment.

Figure 10:
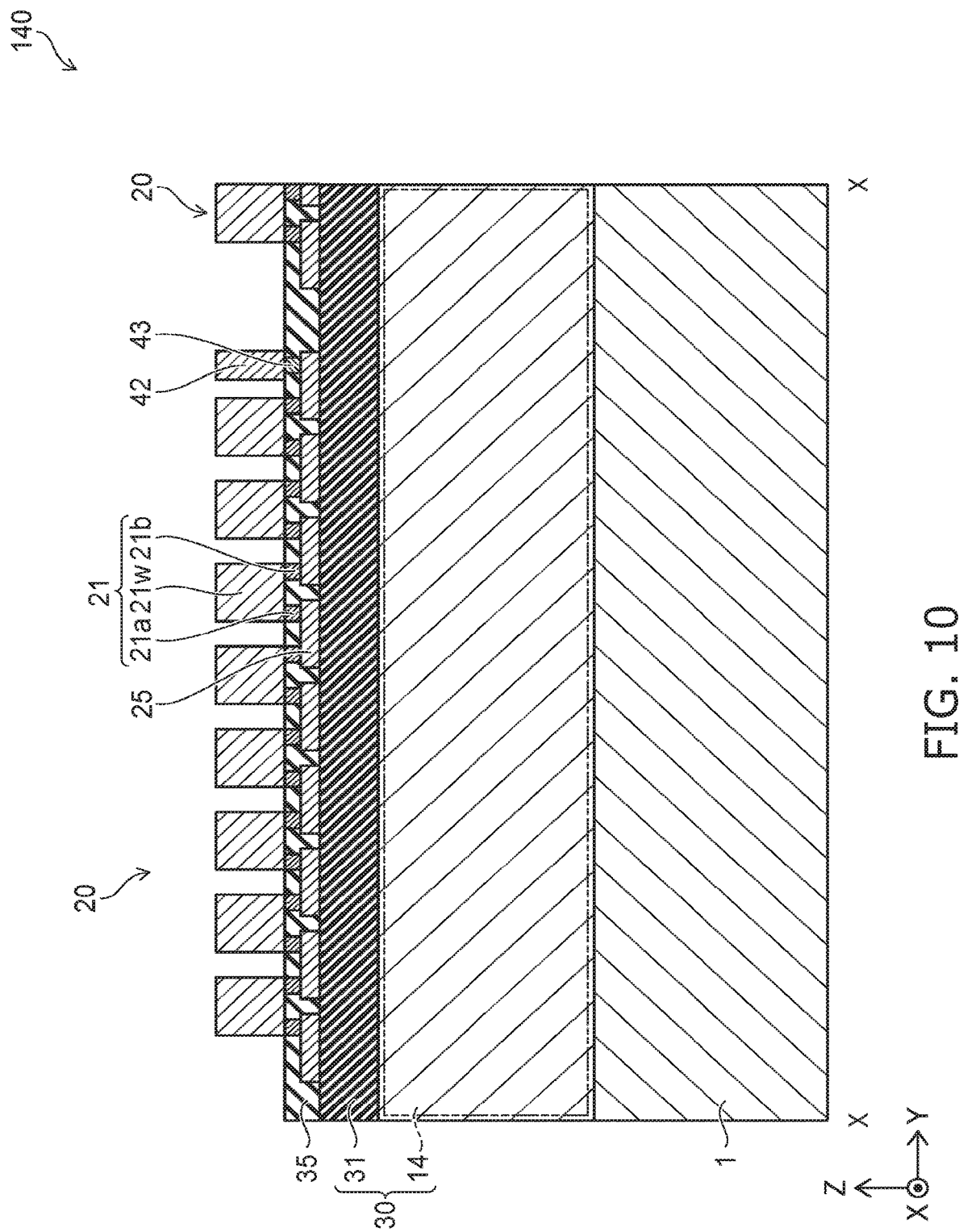
FIG. 10 is an X-X cross-sectional view of FIG. 9.

FIG. 10 is an X-X cross-sectional view of FIG. 9.

In the light detector 140 according to the fourth embodiment, the quenching resistance 20 includes the multiple semiconductor members 25 and the multiple first metal members 21. The multiple semiconductor members 25 and the multiple first metal members 21 are connected in series alternately.

Specifically, each first metal member 21 includes the first wiring part 21w, the first connection part 21a, and the second connection part 21b. The first connection part 21a of one first metal member 21 is electrically connected to one end of the semiconductor member 25; and the second connection part 21b of the one first metal member 21 is electrically connected to one end of another semiconductor member 25.

For example, when the difference between the electrical resistivity of the first metal member 21 and the electrical resistivity of the semiconductor member 25 is small, it is favorable for the multiple first metal members 21 and the multiple semiconductor members 25 to be connected in series alternately as in the fourth embodiment. Thereby, the electrical resistances of the first metal member 21 and the semiconductor member 25 both can be increased while compensating the temperature dependence of the electrical resistance of the semiconductor member 25 with the temperature dependence of the electrical resistance of the first metal member 21.

Fifth Embodiment

Figure 11:
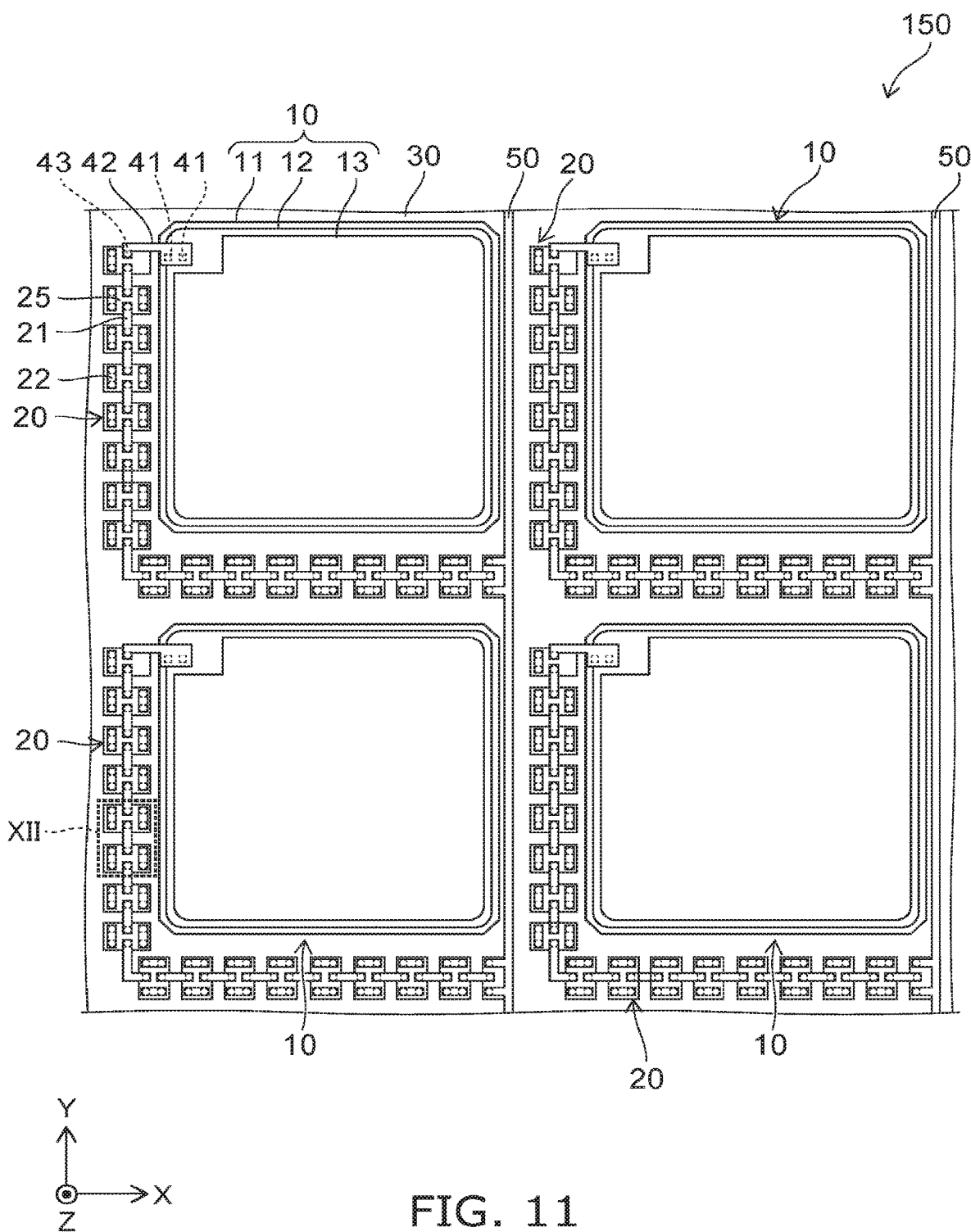
FIG. 11 is a schematic plan view illustrating a light detector according to a fifth embodiment.

FIG. 11 is a schematic plan view illustrating a light detector according to a fifth embodiment.

Figure 12:
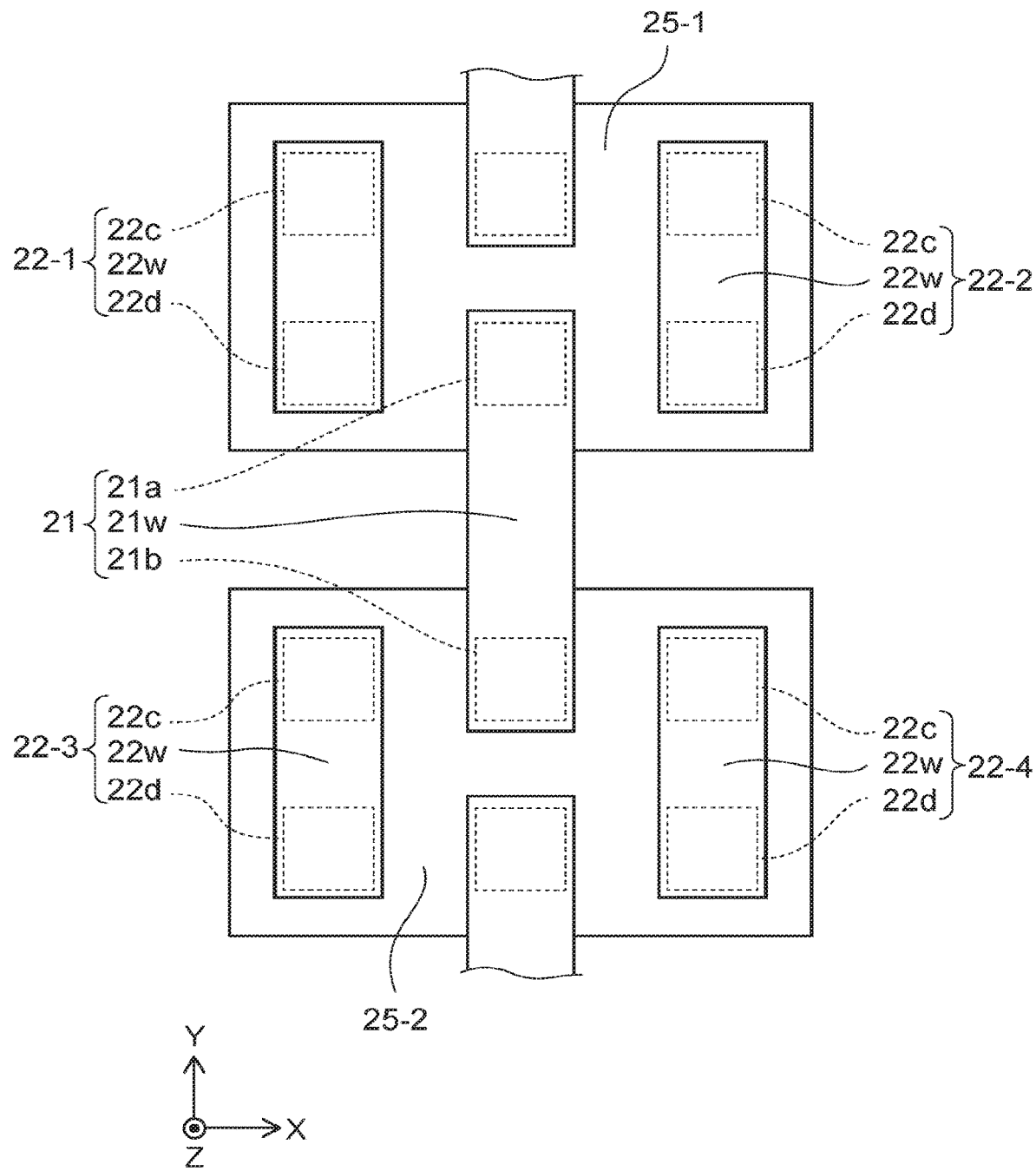
FIG. 12 is a plan view in which portion XII of FIG. 11 is enlarged.

FIG. 12 is a plan view in which portion XII of FIG. 11 is enlarged.

As shown in FIG. 11, the light detector 150 according to the fifth embodiment differs from the light detector 140 in that the quenching resistance 20 further includes the second metal member 22.

The multiple first metal members 21 and the multiple second metal members 22 are separated from each other. The multiple semiconductor members 25 and the multiple first metal members 21 are connected in series alternately. One or more second metal members 22 is connected in parallel to one semiconductor member 25.

As shown in FIG. 12, each first metal member 21 includes the first wiring part 21w, the first connection part 21a, and the second connection part 21b. Each second metal member 22 includes the second wiring part 22w, the third connection part 22c, and the fourth connection part 22d.

For example, two semiconductor members 25-1 and 25-2 are shown in FIG. 12. Four second metal members 22-1 to 22-4 also are shown. The first connection part 21a of the first metal member 21 is electrically connected to the semiconductor member 25-1. The second connection part 21b of the first metal member 21 is electrically connected to the semiconductor member 25-2. Two second metal members 22 are connected in parallel to each of the semiconductor members 25-1 and 25-2.

By further providing the second metal member 22, compared to the light detector 140 according to the fourth embodiment, the proportion of the electrical resistance of the metal part of the quenching resistance 20 can be increased. Accordingly, according to the fifth embodiment, compared to the fourth embodiment, the temperature dependence of the electrical resistance of the quenching resistance 20 can be reduced further.

Sixth Embodiment

Figure 13:
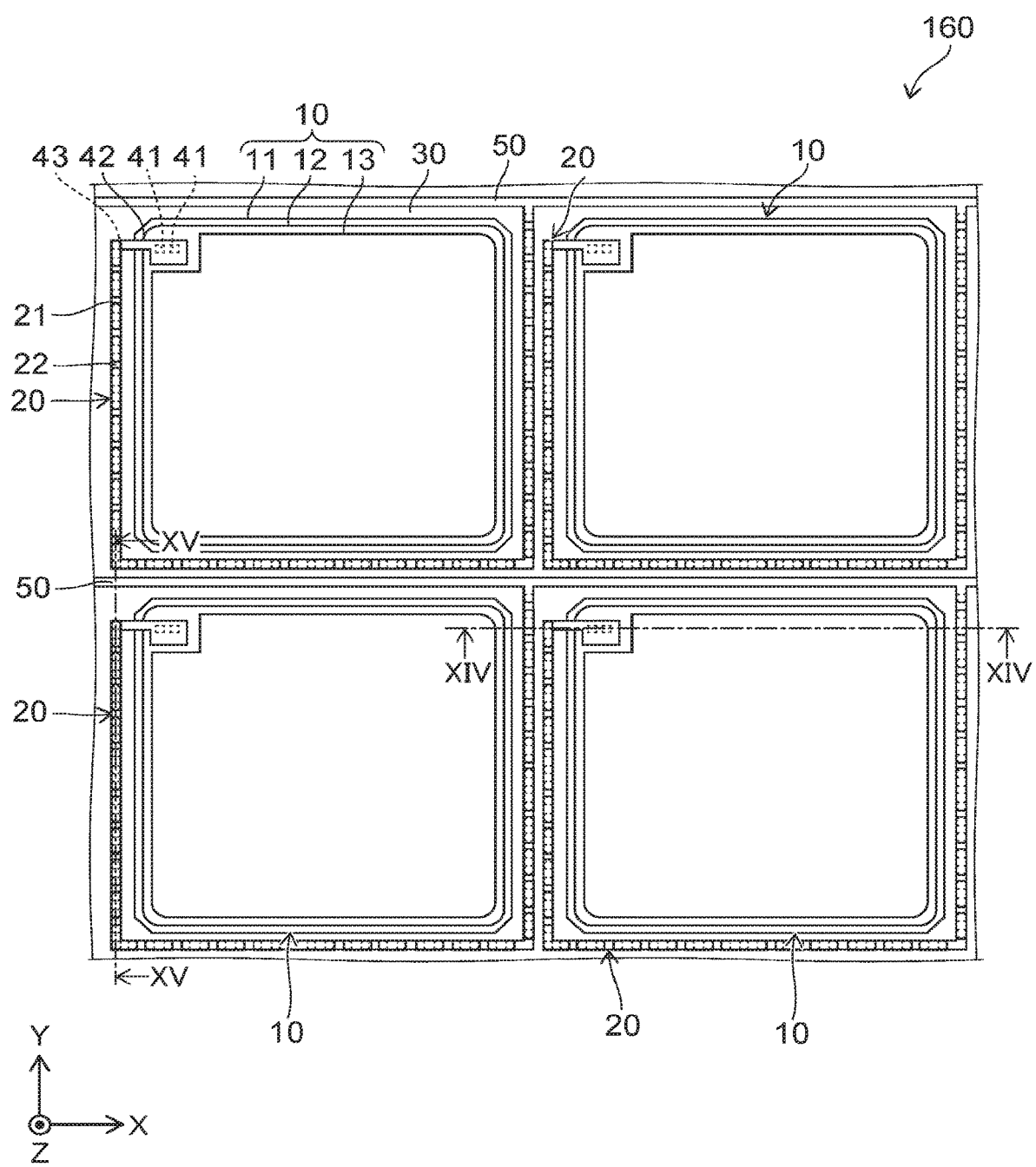
FIG. 13 is a schematic plan view illustrating a light detector according to a sixth embodiment.

FIG. 13 is a schematic plan view illustrating a light detector according to a sixth embodiment.

Figure 14:
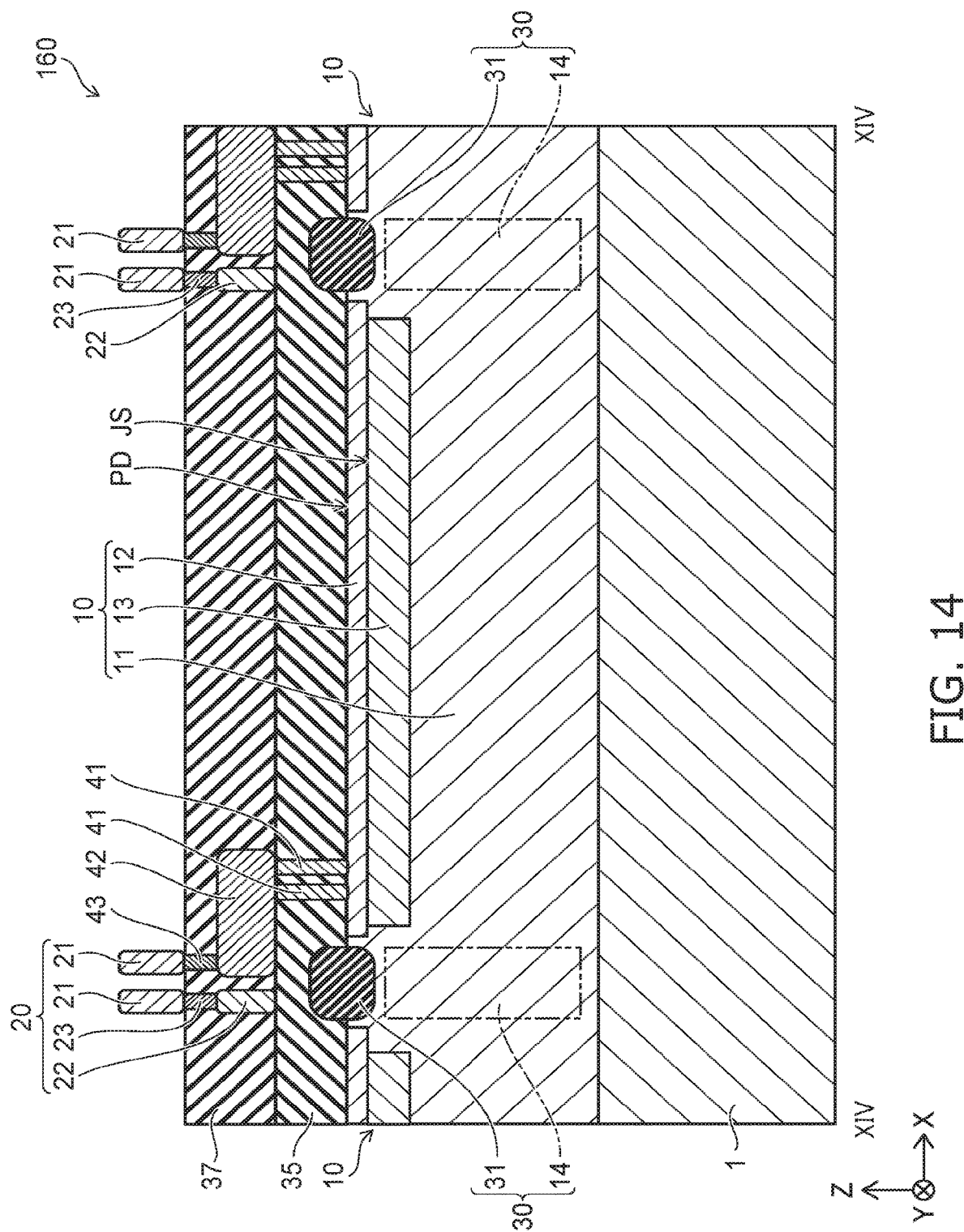
FIG. 14 is a XVI-XVI cross-sectional view of FIG. 13.
Figure 15:
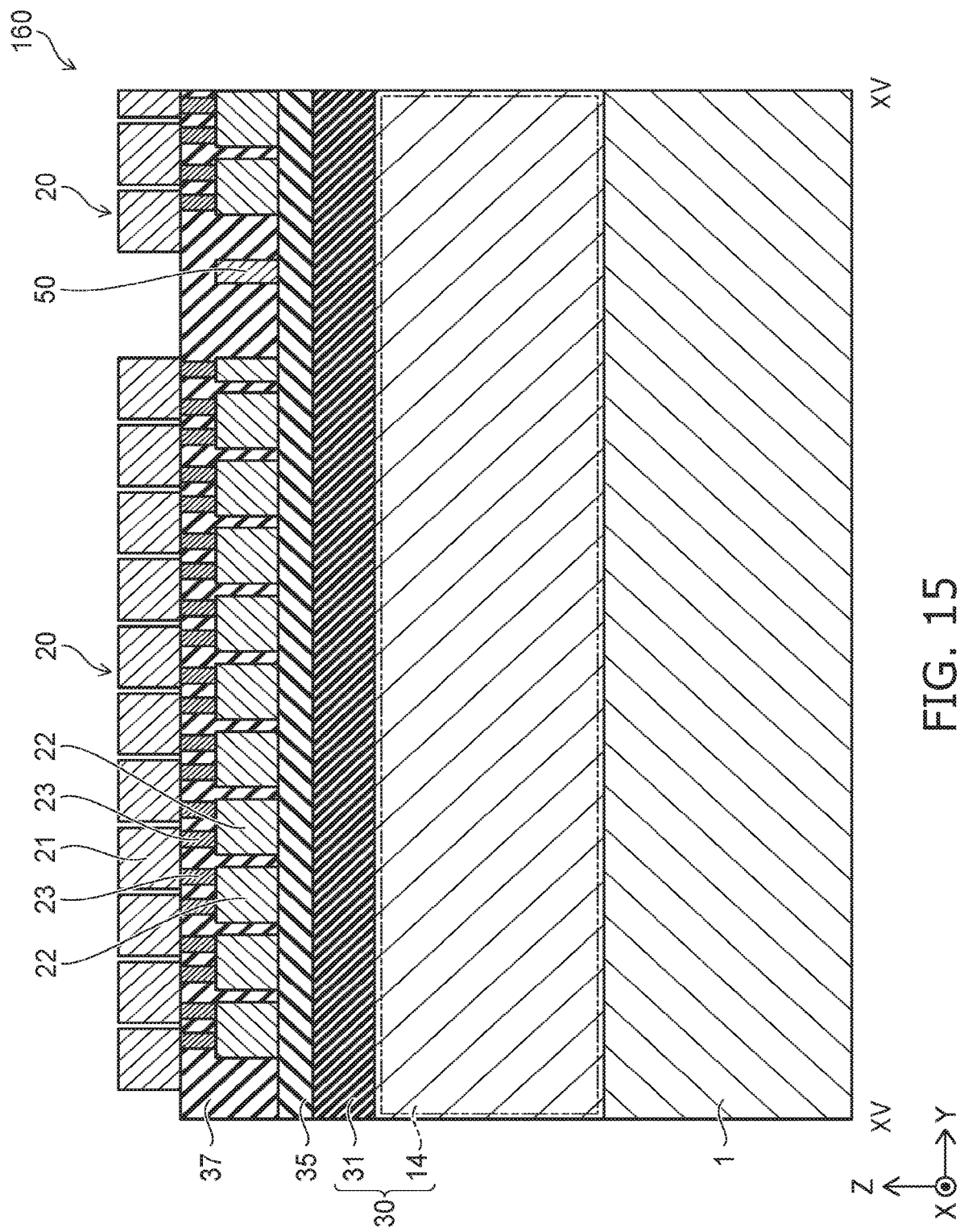
FIG. 15 is a XV-XV cross-sectional view of FIG. 14.

FIG. 14 is a XVI-XVI cross-sectional view of FIG. 13.
FIG. 15 is a XV-XV cross-sectional view of FIG. 14.

In the light detector 160 according to the sixth embodiment as shown in FIG. 13 to FIG. 15, the quenching resistance 20 includes the multiple first metal members 21, the multiple second metal members 22, and multiple connection parts 23. In the light detector 160, the quenching resistance 20 does not include the semiconductor member 25.

As shown in FIG. 15, the multiple first metal members 21 and the multiple second metal members 22 are electrically connected by the multiple connection parts 23. The multiple first metal members 21 and the multiple second metal members 22 are provided in series alternately.

The multiple first metal members 21, the multiple second metal members 22, and the perimeter region 30 are arranged in the Z-direction. For example, the multiple second metal members 22 are provided between the perimeter region 30 and the multiple second metal members 22 in the Z-direction. The first metal members 21 and the connection parts 23 are surrounded with an insulating layer 37 in the X-direction and the Y-direction.

As described above, the electrical resistance of a metal increases as the temperature increases. When the quenching resistance 20 does not include the semiconductor member 25, the electrical resistance of the quenching resistance 20 increases as the temperature increases.

The change of the electrical resistance due to the fluctuation of the processes when forming a metal is less than the change of the electrical resistance due to the fluctuation of the processes when forming a semiconductor. Because the quenching resistance 20 does not include the semiconductor member 25 and includes the first metal member 21 and the second metal member 22, the electrical resistance of the quenching resistance 20 actually manufactured can approach a predetermined value.

The electrical resistance of the connection part 23 is higher than the electrical resistances of the first metal member 21 and the second metal member 22. In the light detector 160, the multiple first metal members 21 and the multiple second metal members 22 are connected in series alternately via the multiple connection parts 23. Thereby, the electrical resistance of the quenching resistance 20 can be increased even when the quenching resistance 20 does not include a semiconductor.

Similarly to the light detector 111, the perimeter region 30 may include the insulating part 32 in the light detectors according to the second to sixth embodiments described above. In such a case as well, effects similar to those of the embodiments described above can be obtained.

Seventh Embodiment

Figure 16:
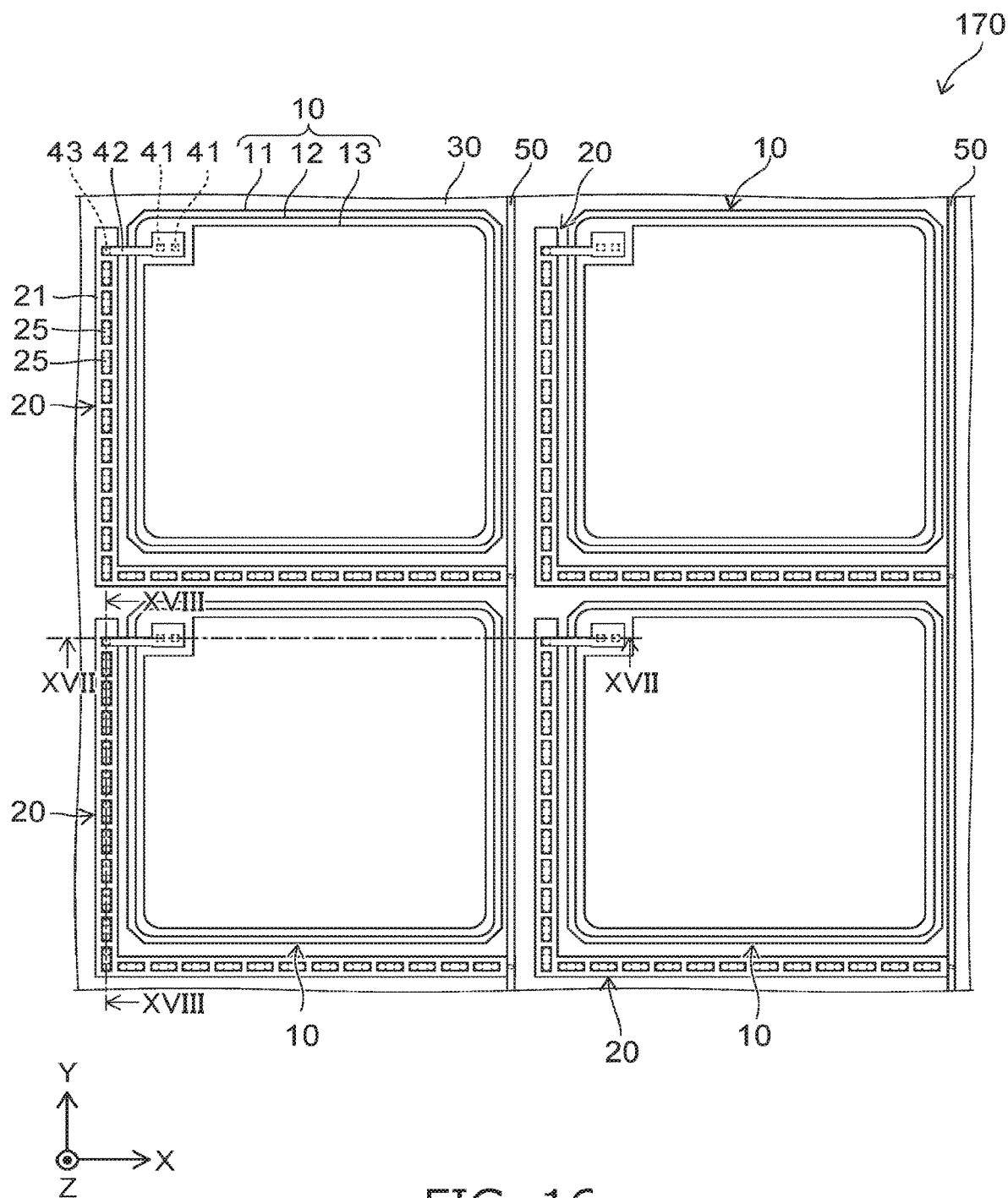
FIG. 16 is a schematic plan view illustrating a light detector according to a seventh embodiment.

FIG. 16 is a schematic plan view illustrating a light detector according to a seventh embodiment.

Figure 17:
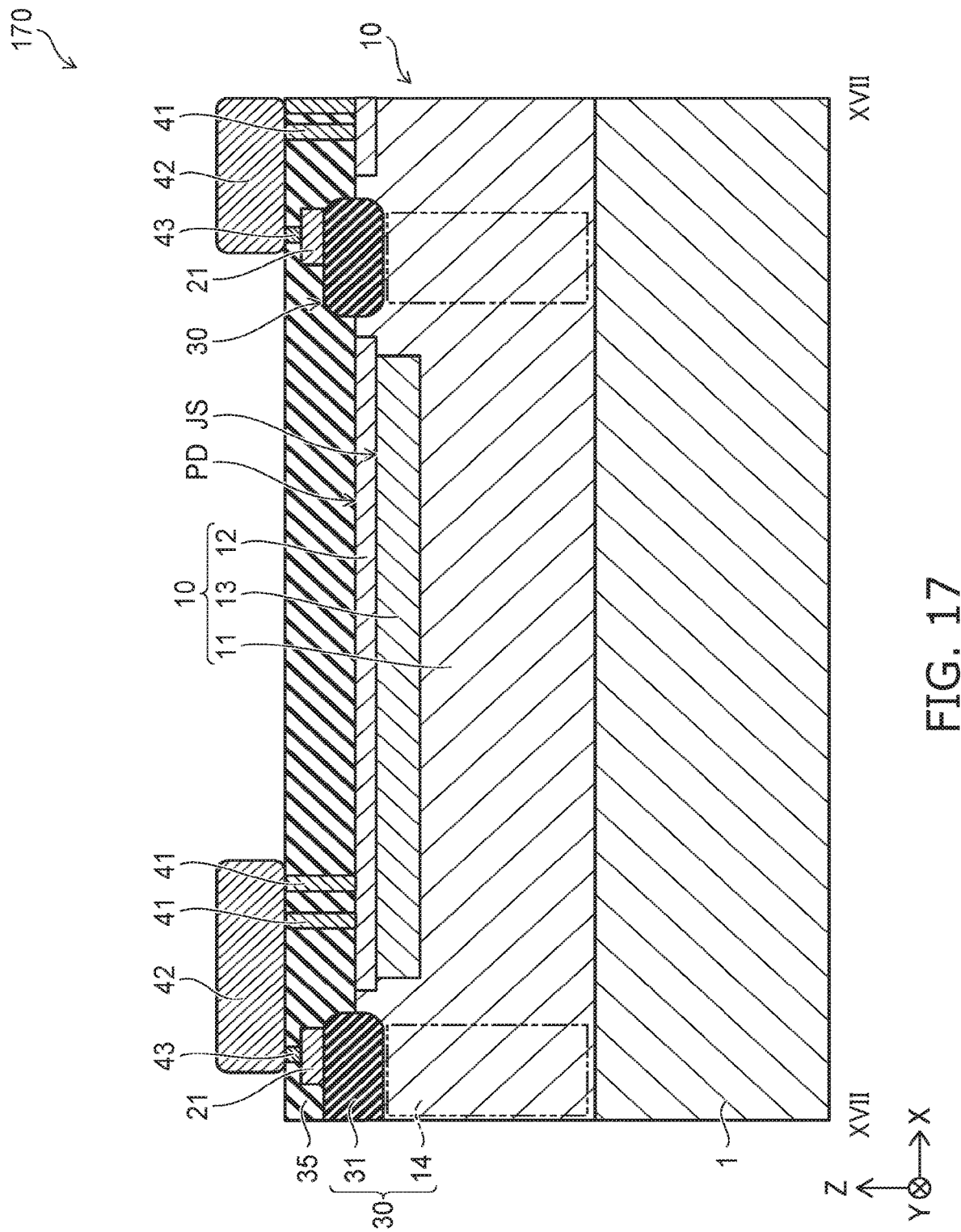
FIG. 17 is a XVII-XVII cross-sectional view of FIG. 16.
Figure 18:
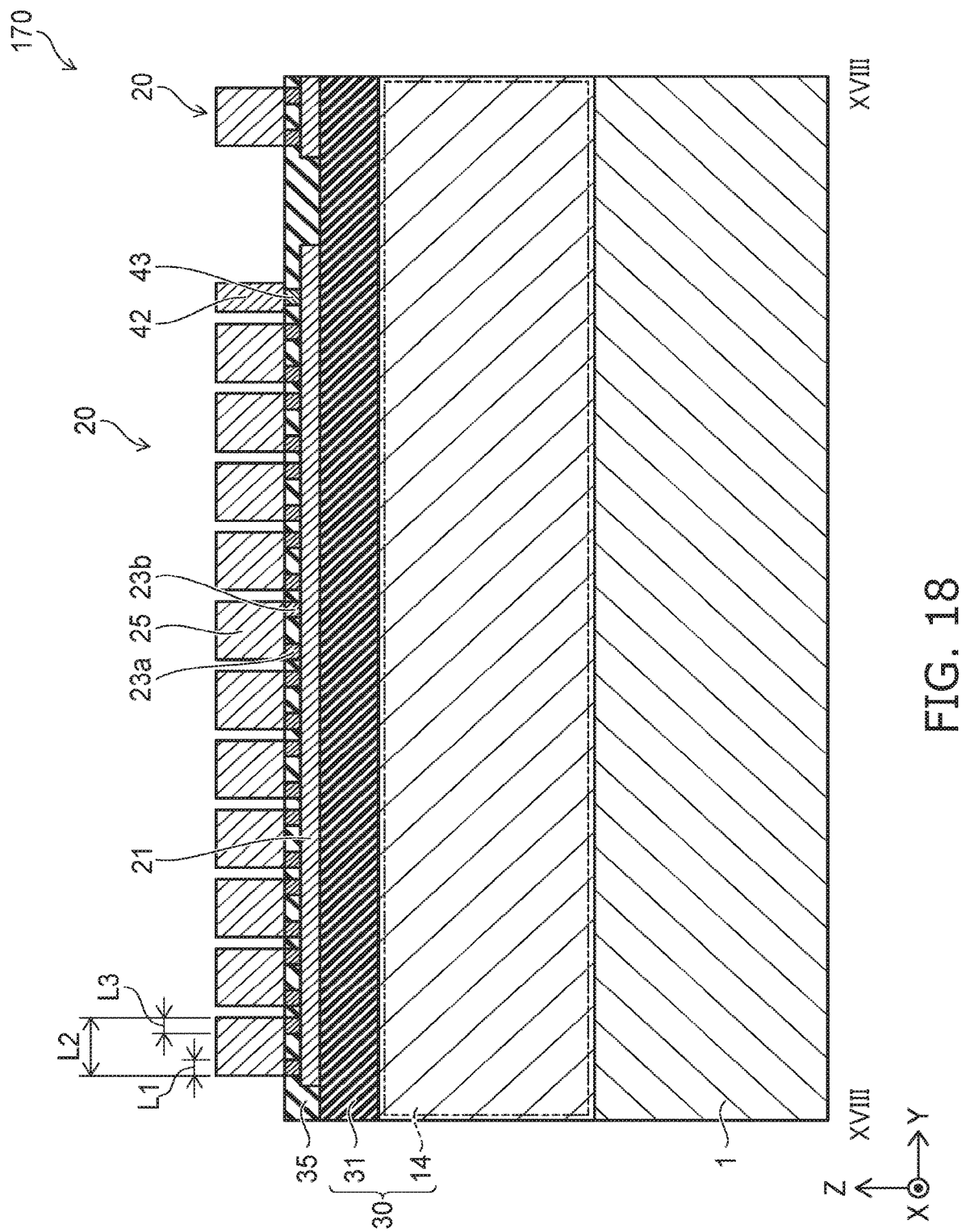
FIG. 18 is a XVIII-XVIII cross-sectional view of FIG. 16.

FIG. 17 is a XVII-XVII cross-sectional view of FIG. 16.
FIG. 18 is a XVIII-XVIII cross-sectional view of FIG. 16.

In the light detector 170 according to the seventh embodiment as shown in FIG. 16 and FIG. 18, the quenching resistance 20 includes the first metal member 21 and the multiple semiconductor members 25. The multiple semiconductor members 25 are separated from each other. The multiple semiconductor members 25 are arranged with the first metal member 21 in the Z-direction.

For example, connection parts 23a and 23b are provided between the first metal member 21 and each semiconductor member 25. The connection parts 23a and 23b are surrounded with the insulating layer 35 in the X-direction and the Y-direction. The connection part 23a electrically connects the first metal member 21 to one end of the semiconductor member 25. The connection part 23b electrically connects the first metal member 21 to the other end of the semiconductor member 25.

As shown in FIG. 16 to FIG. 18, one end of the first metal member 21 is electrically connected to the second semiconductor region 12 via the connection part 41, the wiring layer 42, and the connection part 43. The other end of the first metal member 21 is electrically connected to the common line 50.

According to the seventh embodiment, for example, when the electrical resistivity of the first metal member 21 is lower than the electrical resistivity of the semiconductor member 25, the electrical resistance of the semiconductor member 25 can be increased; and the temperature dependence of the electrical resistance of the quenching resistance 20 can be reduced.

Eighth Embodiment

Figure 19:
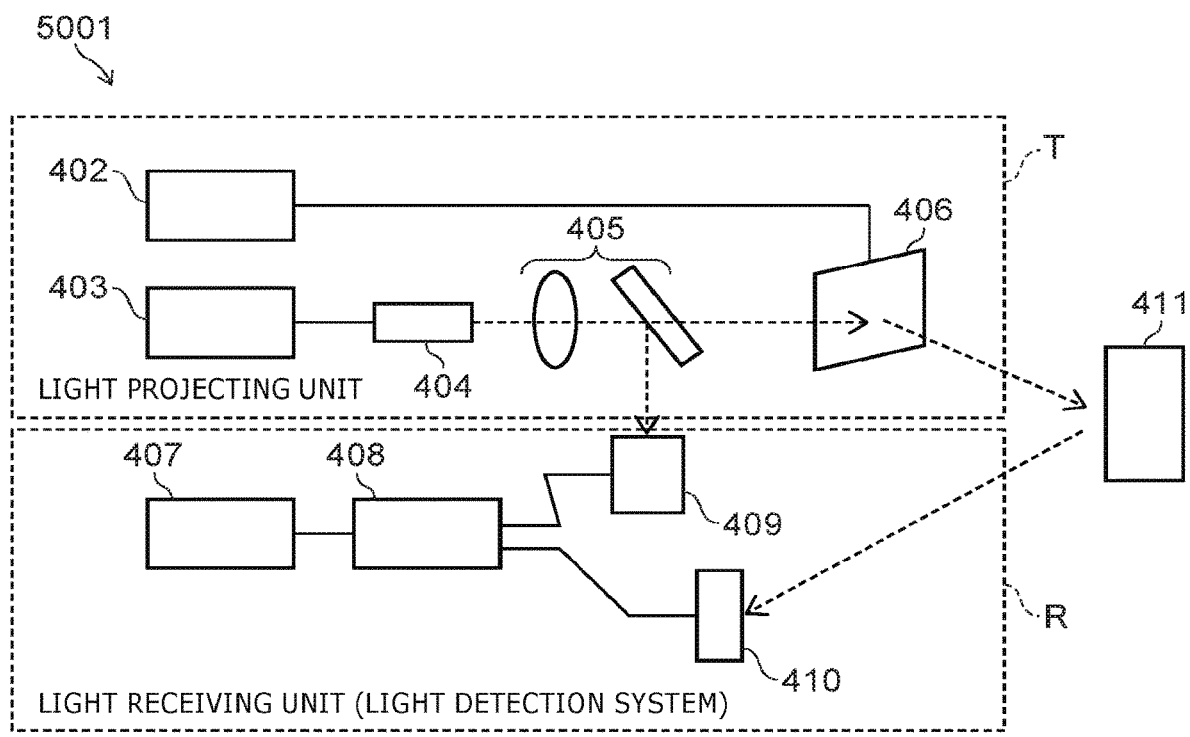
FIG. 19 is a schematic view illustrating a lidar device according to an eighth embodiment.

FIG. 19 is a schematic view illustrating a lidar (Laser Imaging Detection and Ranging) device according to an eighth embodiment.

The embodiment is applicable to a long-distance subject detection system (LIDAR) or the like including a line light source and a lens. The lidar device 5001 includes a light projecting unit T projecting laser light toward an object 411, and a light receiving unit R (also called a light detection system) receiving the laser light from the object 411, measuring the time of the round trip of the laser light to and from the object 411, and converting the time into a distance.

In the light projecting unit T, a laser light oscillator (also called a light source) 404 produces laser light. A drive circuit 403 drives the laser light oscillator 404. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light receiving unit R, a reference light detector 409 detects the reference light extracted by the optical system 405. A light detector 410 receives the reflected light from the object 411. Based on the reference light detected by the reference light detector 409 and the reflected light detected by the light detector 410, a distance measuring circuit 408 measures the distance to the object 411. An image recognition system 407 recognizes the object 411 based on the results measured by the distance measuring circuit 408.

The lidar device 5001 employs light time-of-flight ranging in which the time of the round trip of the laser light to and from the object 411 is measured and converted into a distance. The lidar device 5001 is applied to an automotive drive-assist system, remote sensing, etc. Good sensitivity is obtained particularly in the near-infrared region when the light detectors of the embodiments described above are used as the light detector 410. Therefore, the lidar device 5001 is applicable to a light source of a wavelength band invisible to humans. For example, the lidar device 5001 can be used for obstacle detection in a vehicle.

Figure 20:
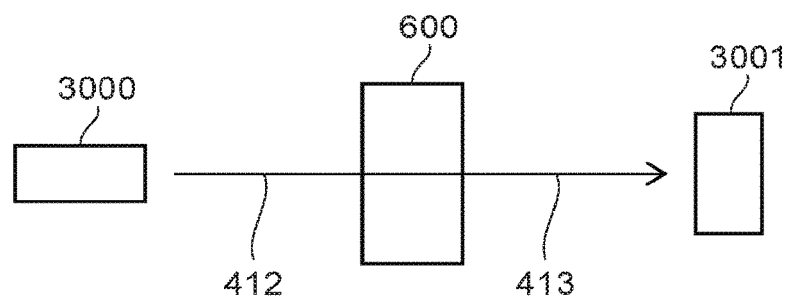
FIG. 20 is a drawing for describing the detection of the detection object of the lidar device.

FIG. 20 is a drawing for describing the detection of the detection object of the lidar device.

A light source 3000 emits light 412 toward an object 600 which is the detection object. A light detector 3001 detects light 413 which passes through the object 600, is reflected by the object 600, or is diffused by the object 600.

For example, the light detector 3001 realizes a highly-sensitive detection when the light detector according to the embodiment described above is used. It is favorable to provide multiple sets of the light detector 410 and the light source 404 and to preset the arrangement relationship in the software (which is replaceable with a circuit). For example, it is favorable for the arrangement relationship of the sets of the light detector 410 and the light source 404 to be at uniform spacing. Thereby, an accurate three-dimensional image can be generated by the output signals of each light detector 410 supplementing each other.

Figure 21:
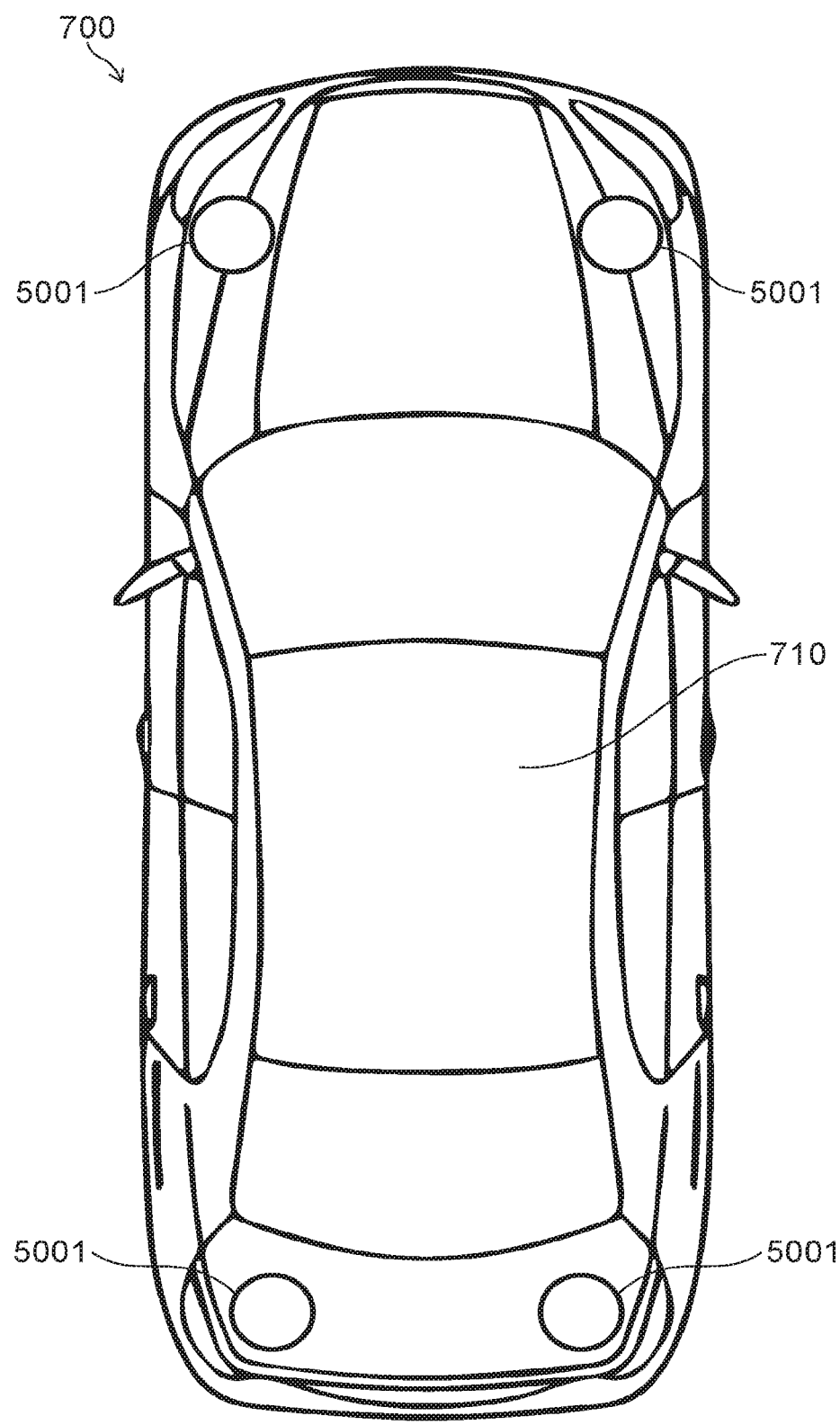
FIG. 21 is a schematic top view of a vehicle including the lidar device according to the eighth embodiment.

FIG. 21 is a schematic top view of a vehicle including the lidar device according to the eighth embodiment.

A vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar devices.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the light detector such as the element, the quenching resistance, the perimeter region, the insulating part, the insulating layer, the common line, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all light detectors, all light detection systems, all lidar devices, and all vehicles practicable by an appropriate design modification by one skilled in the art based on the light detectors, the light detection systems, the lidar devices, and the vehicles described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light detector, comprising:
   an element including a photodiode, a p-n junction of the photodiode being along a first direction and a second direction crossing the first direction; and
   a quenching resistance electrically connected to the element, the quenching resistance including a semiconductor member and a plurality of first metal members, the plurality of first metal members being electrically connected to the semiconductor member and separated from each other, wherein
   when viewed from a third direction, the plurality of first metal members are positioned within the semiconductor member, the third direction is perpendicular to the first direction and the second direction.

2. The detector according to claim 1, wherein
each of the plurality of first metal members includes:
a first wiring part separated from the semiconductor member in the third direction; and
a first connection part and a second connection part, the first connection part and the second connection part electrically connecting the semiconductor member and the first wiring part, being provided between the semiconductor member and the first wiring part, and being separated from each other.

3. The detector according to claim 2, wherein
the semiconductor member includes a first portion extending in the first direction,
the plurality of first metal members are separated from each other in the first direction and arranged with the first portion in the third direction.

4. The detector according to claim 3, wherein
the quenching resistance further includes a plurality of second metal members electrically connected to the first portion,
the plurality of second metal members is separated from each other,
each of the plurality of second metal members includes:
a second wiring part separated from the first portion in the third direction; and
a third connection part and a fourth connection part, the third connection part and the fourth connection part electrically connecting the first portion and the second wiring part, being provided between the first portion and the second wiring part, and being separated from each other, and
a length in the second direction of one of a plurality of the second wiring part is different from a length in the second direction of one of a plurality of the first wiring part.

5. The detector according to claim 4, wherein
the length in the second direction of the one of the plurality of second wiring part is longer than the length in the second direction of the one of the plurality of the first wiring part, and
a length in the first direction of the one of the plurality of second wiring part is longer than a length in the first direction of the one of the plurality of first wiring part.

6. The detector according to claim 4, wherein one of a plurality of the first wiring part is positioned between one of a plurality of the first wiring part and another one of the plurality of first wiring part in the first direction.

7. The detector according to claim 6,
a portion of the one of the plurality of first wiring part is arranged with the one of the plurality of the first wiring part in the second direction, and
a portion of the other one of the plurality of first wiring part is arranged with the one of the plurality of the first wiring part in the second direction.

8. The detector according to claim 1, further comprising a perimeter region surrounding the element in the first direction and the second direction,
at least a portion of the quenching resistance being arranged with the perimeter region in the third direction.

9. The detector according to claim 8, wherein
the perimeter region includes:
a semiconductor region surrounding the element in the first direction and the second direction, the semiconductor region being of a first conductivity type; and
an insulating part provided between the semiconductor region and the quenching resistance in the third direction.

10. The detector according to claim 8, wherein
the element includes a first semiconductor region of a first conductivity type, a second semiconductor region of a second conductivity type, and a third semiconductor region of the first conductivity type, the third semiconductor region being provided between the first semiconductor region and the second semiconductor region in the second direction, and
the perimeter region includes an insulating part surrounding the first semiconductor region, the second semiconductor region, and the third semiconductor region in the first direction.

11. The detector according to claim 1, further comprising wiring electrically connected to the quenching resistance,
the plurality of first metal members each being connected to the semiconductor member in parallel between the element and the wiring.

12. A light detector, comprising:
an element including a photodiode, a p-n junction of the photodiode being along a first direction and a second direction crossing the first direction; and
a quenching resistance electrically connected to the element, the quenching resistance including a semiconductor member and a plurality of first metal members separated from each other, wherein
the semiconductor member includes
a plurality of first parts respectively connected the plurality of first metal members in parallel, and
a plurality of second parts, the plurality of first parts and the plurality of second parts being alternately connected in series,
when viewed from a third direction, the plurality of first metal members are positioned within the semiconductor member,
the third direction is perpendicular to the first direction and the second direction.

13. The detector according to claim 1, Wherein an electrical resistance of the quenching resistance is not less than 50 kΩ and not more than 2 MΩ.

14. The detector according to claim 1, wherein the photodiode is an avalanche photodiode operating in a Geiger mode.

15. The detector according to claim 1, wherein
the element includes a first semiconductor region of a first conductivity type, a second semiconductor region of a second conductivity type, and a third semiconductor region of the first conductivity type, the third semiconductor region being provided between the first semiconductor region and the second semiconductor region,
a p-n junction is formed by the second semiconductor region and the third semiconductor region, and
the quenching resistance is electrically connected to the second semiconductor region.

16. A light detection system, comprising:
the light detector according to claim 1; and
a distance measuring circuit calculating, from an output signal of the light detector, a time-of-flight of light.

17. A lidar device, comprising:
a light source irradiating light on an object; and
the light detection system according to claim 16 detecting light reflected by the object.

18. The lidar device according to claim 17, further comprising an image recognition system generating a three-dimensional image based on an arrangement relationship of the light source and the light detector.

19. A vehicle, comprising the lidar device according to claim 17.

20. A vehicle, comprising the lidar devices according to claim 17 at four corners of a vehicle body.

* * * * *